United States Patent [19]
Takatsuki et al.

[11] Patent Number: 5,656,082
[45] Date of Patent: Aug. 12, 1997

[54] LIQUID APPLYING APPARATUS UTILIZING CENTRIFUGAL FORCE

[75] Inventors: Ryuzoh Takatsuki, Oda-gun; Terumasa Tokimitsu, Kasaoka, both of Japan

[73] Assignee: Tatsumo Kabushiki Kaisha, Okayama-ken, Japan

[21] Appl. No.: 414,083

[22] Filed: Mar. 31, 1995

[30] Foreign Application Priority Data

| Apr. 4, 1994 | [JP] | Japan | 6-066178 |
| Apr. 4, 1994 | [JP] | Japan | 6-066179 |
| May 19, 1994 | [JP] | Japan | 6-105360 |

[51] Int. Cl.$^6$ ............................................. B05C 11/02
[52] U.S. Cl. .................. 118/52; 118/54; 118/55; 118/416; 427/240
[58] Field of Search ................ 118/52, 54, 55, 118/416; 427/240; 277/167.5, 165, 184, 189, 188 A; 220/264, 329, 331, 378

[56] References Cited

U.S. PATENT DOCUMENTS 5,579,718  12/1996  Freerks ........................ 220/378

FOREIGN PATENT DOCUMENTS 568091  5/1992  Japan .

Primary Examiner—Donald E. Czaja
Assistant Examiner—Michael Philip Colaianni
Attorney, Agent, or Firm—Jordan and Hamburg

[57] ABSTRACT

A liquid applying apparatus includes a rotary member having a disk table in which a substrate to be applied with liquid is placed; a cover member movable above the disk table and operable to define a closed space in combination with the disk table; an elevating mechanism which elevates up and down the cover member; a sealing arrangement provided between the disk table and the cover member to seal the closed space, the sealing arrangement including: a resilient sealing ring having a specified sectional size; a ring accommodation annular groove formed in either a top surface of a periphery of the disk table or an underside surface of a periphery of the cover member, the ring accommodation annular groove having a sectional size greater than the sectional size of the sealing ring and being operable to accommodate the sealing ring; a ring pressing annular ridge formed on either a top surface of a periphery of the disk table or an underside surface of a periphery of the cover member, the ring pressing annular ridge having a sectional size smaller than the ring accommodation annular groove, and being engageable with the ring accommodation annular groove, and coming into contact with the sealing ring to press the sealing ring against the ring accommodation annular groove when the cover member is combined with the disk table.

22 Claims, 14 Drawing Sheets

LIQUID APPLYING APPARATUS UTILIZING CENTRIFUGAL FORCE

BACKGROUND OF THE INVENTION

This invention relates to a liquid applying apparatus for applying liquid over a surface of a substrate utilizing centrifugal force.

There has been known a liquid applying apparatus which is used in the step of coating photosensitive material on a substrate in semiconductor device production. Such liquid applying apparatus to be used in the production of semiconductor device is required to uniformly apply a liquid containing photosensitive material onto a whole surface of a substrate such as wafer to form a very thin film over the whole surface of the substrate without any irregularity.

The conventional liquid applying apparatus includes a rotary member having a disk table on which a substrate to be applied with liquid is placed. The rotary member is rotated at a very high speed after a substrate is placed on the disk table and a drop of applying liquid is placed at a center of the substrate. The applying liquid drop spreads over a surface of the substrate owing to the centrifugal force of the high speed rotation of the rotary member, thereby forming a uniform thin film of applying liquid over the whole surface of the substrate.

The conventional liquid applying apparatus is provided with a cover member for defining a closed space above the disk table. The closed space above the disk table is necessary to form a uniform thin film on the surface of the substrate. In the case that the space above the disk table is not closed or opened to the outside, the air near the disk table is disturbed due to the high speed rotation of the disk table mounted on the rotary member. The disturbed air influences the centrifugal spreading of applying liquid and consequently causes irregularities in a liquid film formed on the substrate surface. The cover member is capped on the disk table to define a closed space to prevent the air disturbance due to the flow-in of air from the outside.

More specifically, the disk table has an annular vertical wall on a periphery of the disk table to surround the substrate placed in the disk table. The cover member is placed on a top surface of the peripheral vertical wall to define the closed space. The cover member is rotatably supported by a holder member. The cover member can rotate integrally with the disk table when the rotary member is rotated at the high speed. The holder member is mechanically connected with an elevating mechanism. The cover member is moved up and down by the elevating mechanism to open and close the space above the disk table.

In the conventional applying apparatus, to ensure the integral rotation of the disk table and the cover member, a standing pin is provided at a specified position of the periphery of the disk table while a fork portion is formed at a specified position of the periphery of the cover member. When the cover member is mounted on the disk table, a recess of the fork portion of the cover member is engaged with the standing pin on the top surface of the disk table.

However, the cover member is rotatably supported by the holder member. Accordingly, when the cover member is moved up and separated from the disk table, there is a likelihood that the cover member inadvertently rotate. This will make it cumbersome or difficult to engage the fork portion with the standing pin when mounting the cover member on the disk table. Further, if the rotary member is rotated at the high speed with the state where the cover member is not accurately set on the disk table, that is, the state where the fork portion is not engaged with the standing pin, the following problems will be likely to occur: Since the rotating force of the rotary member is not directly transmitted to the cover member, the disk table and the cover member hit against each other to generate vibration which will crack off dust powder from the cover member and the disk table. The cracked off dust powder will escape in the air around the apparatus or stray in the closed space to contaminate an applying liquid film being formed.

Also, to ensure the sealing of the close space above the disk table, a sealing ring or O-ring made of rubber is fitted in an annular groove formed in the top surface of the peripheral vertical wall of the disk table. It will be seen that to ensure airtightness of the closed space, the O-ring is required to partly protrude from the annular groove to enable contact with an underside surface of the cover member when the cover member is mounted on the disk table. Also, it will be seen that there is the necessity of preventing the O-ring from slipping from the groove formed in the disk table.

For these reasons, in the conventional liquid applying apparatus, the annular groove for retaining an O-ring is shaped into a trapezoid form in a radial section, that is, its top width is narrower than its bottom width. In other words, the opening width of the annular groove is smaller than the diameter of the O-ring.

However, since the opening of the annular groove is narrower than the diameter of the O-ring, the operation of inserting the O-ring in the groove is very troublesome. Also, it has been impossible to set the O-ring in the groove in the perfect state that the top line of the O-ring is on the same level along the entire circumference. Further, such forcible inserting of the O-ring has often caused polarizations in the elasticity of the O-ring along the circumference thereof.

Accordingly, in the actual setting of O-ring, the top line of the O-ring is not on the same level, but on different levels along the circumference, in other words, the level of the protruding portion of the O-ring is different along the circumference of the O-ring. The top line level difference of the O-ring causes gaps between the underside of the cover member and the O-ring, consequently breaking up the closed space above the disk table. As mentioned above, imperfect closed space above the disk table brings about the air disturbance, consequently making it impossible to form a uniform thin film on the substrate.

SUMMARY OF THE INVENTION

It is an object of the present invention to provide a liquid applying apparatus which has overcome the above-mentioned problems in the prior art.

It is another object of the present invention to provide a liquid applying apparatus which makes it possible to define a perfect closed space above a substrate easily.

The present invention is directed to a liquid applying apparatus comprising: a rotary member having a disk table in which a substrate to be applied with liquid is placed; a driving mechanism which drives the rotary member at a high speed; a cover member movable above the disk table and operable to define a closed space in combination with the disk table; an elevating mechanism which elevates up and down the cover member; a sealing arrangement provided between the disk table and the cover member to seal the closed space, the sealing arrangement including: a resilient sealing ring having a specified sectional size; a ring accommodation annular groove formed in either a top surface of a periphery of the disk table or an underside surface of a periphery of the cover member, the ring accommodation annular groove having a sectional size greater than the sectional size of the sealing ring and being operable to accommodate the sealing ring; a ring pressing annular ridge formed on either a top surface of a periphery of the disk table or an underside surface of a periphery of the cover member, the ring pressing annular ridge having a sectional size smaller than the ring accommodation annular groove, and being engageable with the ring accommodation annular groove, and coming into contact with the sealing ring to press the sealing ring against the ring accommodation annular groove when the cover member is combined with the disk table.

The ring accommodation annular groove may be defined by an inner annular ridge and an outer annular ridge formed on the top surface of the disk table. The ring pressing annular ridge may be defined by an inner annular groove and an outer annular groove formed in the underside surface of the cover member, the inner and outer annular groove being engageable with the inner and outer annular ridges formed on the disk table.

The sealing ring may be made such a diameter as to come into contact with one of the inner and outer annular ridges formed on the disk table and as to be apart from the other. The ring pressing annular ridge formed on the cover member may made to have an end portion insertable in a space between the one contact annular ridge and the sealing ring so that the insertable end portion of the ring pressing annular ridge pushes the sealing ring to the one contact annular ridge when the cover member is combined with the disk table. One contact annular ridge is the outer annular ridge formed on the disk table. Also, the one contact annular ridge may be the inner annular ridge formed on the disk table. Further, the end portion of the annular ridge may be formed with a slanting surface for pushing the sealing ring to the one contact annular ridge. The end portion of the annular ridge may be further formed with a horizontal surface for pushing down the sealing ring.

The one contact annular ridge may be formed with a flange on an upper portion thereof to keep the sealing ring from slipping out of the ring accommodation annular groove.

The one contact annular ridge may be formed with a wedge-like groove in a contact side wall thereof to partly retain the sealing ring.

Further, it may be appreciated that the ring accommodation annular groove is defined by an inner annular ridge formed on the top surface of the disk table and a plurality of standing pins provided along a circle on the top surface of the disk table, the circle having a diameter greater than the inner annular ridge; and the ring pressing annular ridge is formed on the underside surface of the cover member. The cover member may be formed with a plurality of recesses in an outermost periphery thereof, the recesses are engageable with the plurality of standing pins on the disk table.

Furthermore, it may be appreciated that the ring accommodation annular groove is formed in the underside surface of the cover member; and the ring pressing annular ridge is formed on the top surface of the disk table. The sealing ring may made to have a section of a circle.

Also, the present invention is directed to a liquid applying apparatus comprising: a rotary member having a disk table in which a substrate to be applied with liquid is placed; a driving mechanism which drives the rotary member at a high speed; a cover member movable above the disk table and operable to define a closed space in combination with the disk table; an elevating mechanism which elevates up and down the cover member, the elevating mechanism including a holder member for holding the cover member; and a connecting arrangement provided between the cover member and the holder member for connecting the cover member and the holder member when the cover member is elevated up, and disconnecting the cover member from the holder member when the cover member is combined with disk table, the connecting arrangement including: a flange formed on either the cover member or the holder member, the flange having an outer periphery having a portion whose curvature is different from the other portion of the outer periphery; and a hole formed in either the cover member or the holder member, the hole having an inner periphery corresponding to the outer periphery of the flange.

It may be appreciated that the outer periphery of the flange is formed with a slanting surface and the inner periphery of the hole is formed with a slanting surface in correspondence with the slanting surface of the outer periphery of the flange.

The flange and the hole may each be shaped into a polygonal form. The flange and the hole may each be shaped into a square form.

Further, it may be appreciated that the cover member is formed with a neck portion at a center on a top surface thereof, the flange being formed on an upper portion of the neck portion; and the hole is formed in a center of the holder member.

Further, it may be appreciated that the holder member is formed with a hanger portion at a center on an underside surface thereof, the flange being formed on a lower portion of the hanger portion; and the hole is formed in a center of the cover member.

With thus constructed liquid applying apparatus, the ring accommodation annular groove is formed in either the cover member or the disk table. The ring accommodation annular groove has a sectional size greater than the sectional size of the sealing ring. Accordingly, the sealing ring can be placed in the ring accommodation annular groove more easily. This eliminates the forcible insertion of sealing ring as have been carried out in the conventional apparatus, thereby preventing the top line level of the sealing ring from differentiating one portion from another along the circumference of the sealing ring, and then assuring a perfect sealing. Also, since the forcible inserting of sealing ring is eliminated, uniform elasticity can be kept along the entire circumference of the sealing ring. Accordingly, uniform centrifugal force can be attained, which will assure a uniform formation of thin film of applying liquid. Further, the cover member and the disk table can be integrally rotated without the likelihood that they hit each other and cause vibrations.

The ring pressing annular ridge is formed on either the cover member or the disk table. This ridge will assuredly maintain the sealing ring in the ring accommodation annular groove.

The sealing ring is pressed against one side of the ring accommodation annular groove by the end portion of the pressing ridge. This will assuredly prevent the sealing ring from displacing in a radial direction. The slanting surface contact surface formed on the end portion of the pressing annular ridge will assure smooth insertion of the pressing annular ridge and then increase the retaining of sealing ring.

Also, the liquid applying apparatus of the present invention is provided with the connecting arrangement including the flange being formed with an outer periphery having a portion whose curvature is different from the other portion, and the hole being formed with an inner periphery corresponding to the outer periphery of the flange. This connecting arrangement facilitates the positioning of the cover member relative to the disk table. In other words, the connecting arrangement makes it possible to always elevate up and down the cover member at a fixed relative position with respect to the disk table because of the correspondence of the specially shaped peripheries of the flange and the hole. Also, the flange and the hole are formed in the respective centers of the cover and the disk table. This will make the centering or alignment of centers of the cover member and the disk table more easy.

Further, the respective peripheries of the flange and the hole are formed with a slanting surface. Accordingly, the connection of the flange and the hole can be smoothly attained.

The above and other objects, features and advantages of the present invention will become more apparent upon a reading of the following detailed description and drawings.

DETAILED DESCRIPTION OF THE PREFERRED EMBODIMENTS OF THE INVENTION

Figure 1:
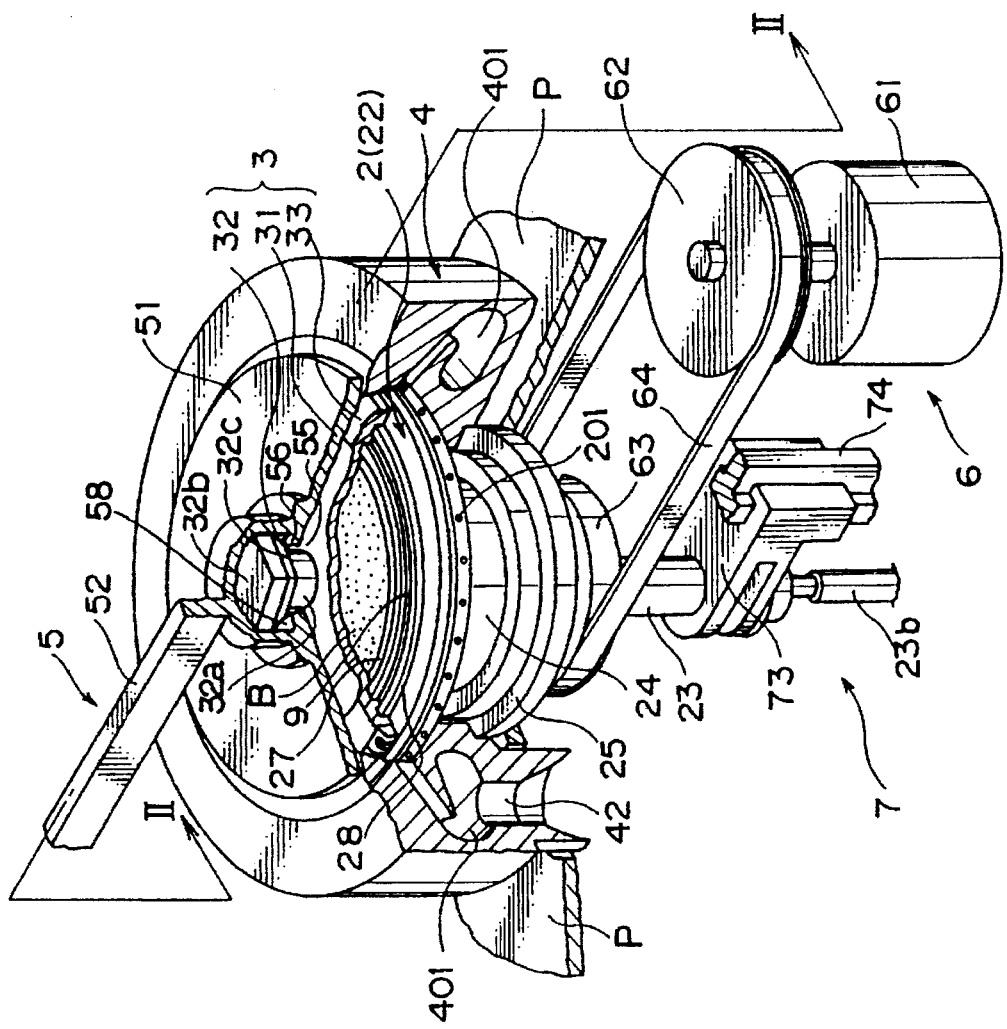
FIG. 1 is a partially cutaway perspective view showing a liquid applying apparatus embodying the present invention.
Figure 2:
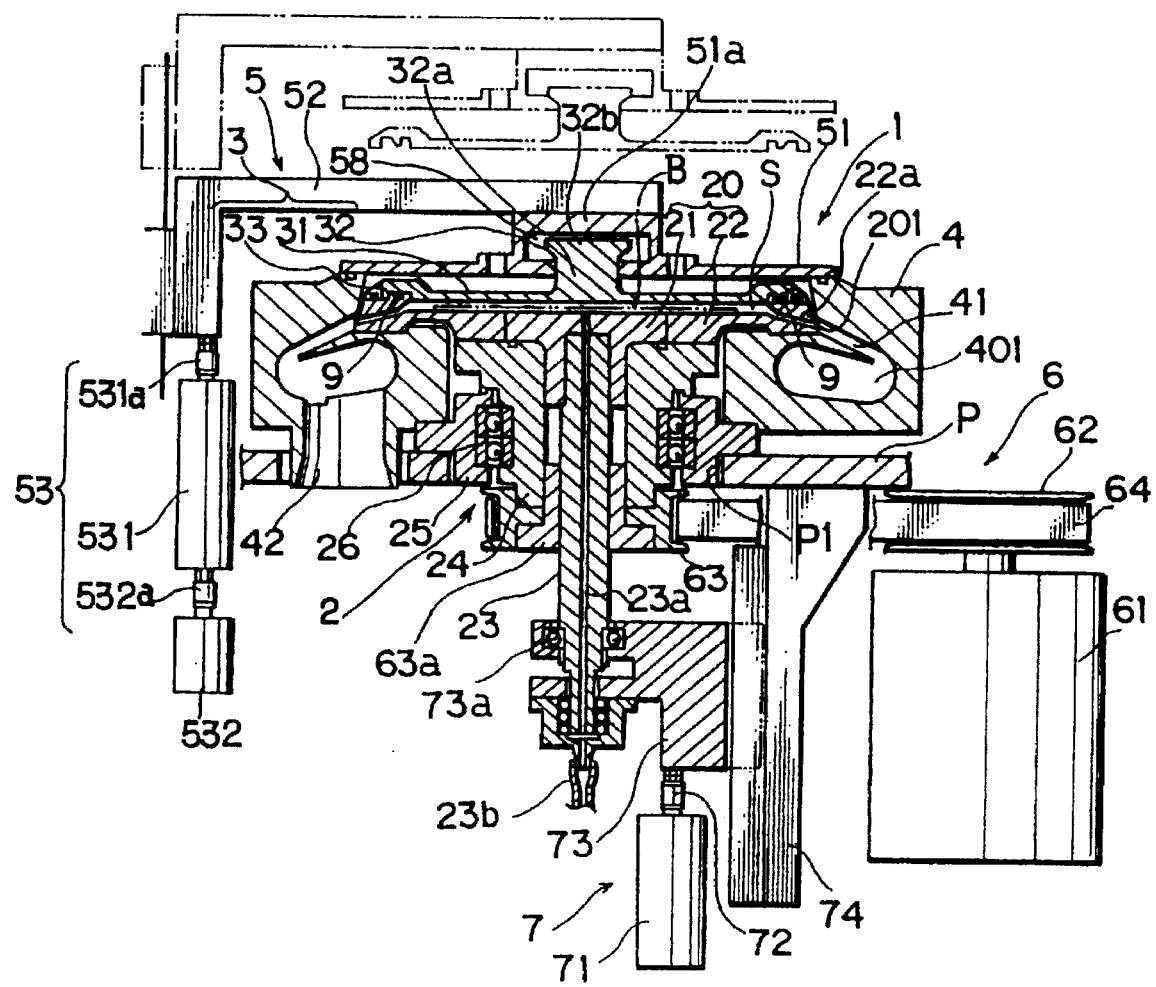
FIG. 2 is a cross sectional view of the liquid applying apparatus taken along the line II—II in FIG. 1.

FIG. 1 is a partially cutaway perspective view showing a liquid applying apparatus according to the present invention, and FIG. 2 is a cross sectional view of the apparatus taken along the line II—II in FIG. 1.

As seen from FIGS. 1 and 2, the liquid applying apparatus 1 comprises a rotary member 2 including a rotary cylinder 24 and a disk table 20 formed on a top of the rotary cylinder 24, a cover member 3 for defining a closed space above the disk table, a housing 4 in which the rotary member 2 is mounted, a cover member elevating mechanism 5 for elevating up and down the cover member 3, a rotary member driving mechanism 8 for rotating the rotary member 2 at a high speed, and a center shaft elevating mechanism 7 for elevating a center shaft provided in a center of the rotary member 2.

The disk table 20 has a center portion 21 and a ring portion 22. A surface of the center portion 21 is made flush with or slightly raised than a surface of the ring portion 22. A substrate B in the form of a disc is placed on the surface of the center portion 21 coaxially. The ring portion 22 is formed with a surrounding wall 22a on a periphery thereof. The surrounding wall 22a has a specified height on which the cover member 3 is to be placed. The surrounding wall 22a and the cover member 3 define a closed space S above the disk table 20.

The surrounding wall 22a is formed with a number of drainage holes 201 at a specified interval in a lower portion thereof. Each drainage hole 201 extends radially outward from the space S at a downward inclination. An excessive amount of applying liquid which have been flied from the surface of the substrate B is drained from the space S to the outside through the drainage holes 201.

The center shaft 23 is coaxially coupled to an under-side of the center portion 21 and rotatable together with the center portion 21. The center portion 21 and the center shaft 23 are commonly formed with an air passage 23a which is communicated with an unillustrated vacuum pump by a way of a tube 23b. The air inside the closed space S is vacuumed through the air passage 23a by the vacuum pump so that the substrate B is attracted onto the center portion 21.

The rotary cylinder 24 is formed with a flange for fixedly supporting the ring portion 22 of the disk table 20. The rotary cylinder 24 is disposed in a hole P1 formed in a support plate P and supported on the support plate P by a way of a support ring 25 and a bearing 26.

The rotary cylinder 24, the center portion 21 and ring portion 22 of the disk table 20 are arranged coaxially with one another. The rotary cylinder 24 is fixedly attached with a driven pulley 63 at a lower portion thereof. The driven pulley 63 is driven by the driving mechanism 6 to be described later.

The cover member 3 includes a disk portion 31, a neck portion 32, and a rim portion 33. The neck portion 32 has a specified height and is disposed at a center of the disk portion 31. The rim portion 33 is formed on a periphery of the disk portion 31. When the cover member 3 is moved down, the rim portion 33 comes into contact with a top surface of the surrounding wall 22a to define the closed space S.

The neck portion 32 has a cylindrical stem section 32a and a square flange section 32b above the cylindrical stem section 32a. The square flange section 32b has a width larger than a diameter of the cylindrical stem section 32a. The neck portion 32 is mechanically connected with a holder member 51 connected to the cover member elevating mechanism 5 as described later.

The housing 4 has generally a ring shape and is fixedly supported on the support plate P by the way of the support ring 25. The housing 4 rotatably accommodates the rotary member 2 therein.

The housing 4 is internally formed with an annular passage 401 in the form of a doughnut. The annular passage 401 is communicated with the drainage holes 201 by a way of an annular gap 41 and also communicated with the outside of the apparatus by a way of a vertical hole formed at a specified portion of the housing 4. In this drainage arrangement, unnecessary excessive applying liquid is discharged from the closed space S to the annular passage 401 through the annular gap 41, and to the outside of the apparatus through the vertical hole 42.

The cover member elevating mechanism 5 is disposed near the housing 4, and includes the holder member 51 for holding the cover member 3, an elevating arm 52 connected to the holder member 51, and an elevating cylinder system 53 for moving up and down the elevating arm 52. The elevating arm52 includes a horizontal section connected to the holder member 51, and a vertical section. The elevating cylinder system 53 includes a long-stroke cylinder 531 and a short-stroke cylinder 532. The long-stroke cylinder 531 is adapted for moving up and down the elevating arm 52 at a high speed. The short-stroke cylinder 532 is adapted for moving up and down the elevating arm 52 at a low speed. The cylinders 531 and 532 are disposed serially in a vertical direction.

The short-stroke cylinder 532 is provided with a cylinder rod 532a at a top portion. An upper end of the cylinder rod 532a is coupled to a bottom portion of the long-stroke cylinder 531. The long-stroke cylinder 531 is provided with a cylinder rod 531a at a top portion thereof. An upper end of the cylinder rod 531a is fixedly attached to the vertical section of the elevating arm 52.

The holder member 51 is formed with a boss portion 51a at a center thereof. The boss portion 51a is fixedly attached to the horizontal section of the elevating arm 52, and is formed with an inner space 58 therein and a square hole 55 in a bottom center thereof. The square hole 55 has a width larger than the outer diameter of the cylindrical stem section 32a and smaller than the width of the square flange section 32b. The square flange section 32b of the neck portion 32 is accommodated in the square hole 55. As the holder member 51 is moved up by the elevating arm 52, the square flange section 32b of the neck portion 32 engages with the square hole 55 of the boss portion 51a of the holder member 51. Consequently, the cover member 3 is moved up together with the holder member.

The holder member 51 is elevated up and down in two steps using the short-stroke cylinder 532 and the long-stroke cylinder 531. The two-step elevation is carried out as follows.

In the movement of elevating up, first, the cover member 3 is moved up at a low speed by the short-stroke cylinder 532 to suppress undesirable abrupt pressure change in the space S, thereby preventing dusts and foreign matters from entering the space S. Second, the cover member 3 is moved up at a high speed by the long-stroke cylinder 531 after confirming that the pressure in the space S becomes equal to the atmospheric pressure, thereby reducing the movement time of the cover member 3.

In the movement of elevating down, the cover member 3 is first moved down at a high speed by the long-stroke cylinder and then moved down at a low speed by the short-stroke cylinder not only to reduce the movement time but also to assure accurate setting of the cover member 3 on disk table 20.

The rotary member driving mechanism 6 is arranged below the support plate P to rotate the rotary member 2 about the axis of the center shaft 23. The rotary member driving mechanism 6 includes a drive motor 61, the drive pulley 62 fixedly attached on a driving shaft of the drive motor 61, the driven pulley 63 fixedly attached to the rotary cylinder 24 by a ball spline 63a, and a belt 64 stretched between the drive pulley 62 and the driven pulley 63. The ball spline 63a is meshed with splines formed in the periphery of the center shaft 23, and fitted into the center hole of the rotary cylinder 24 to fixedly attach the driven pulley 63 to the rotary cylinder 24.

With this arrangement, when the drive motor 61 is rotated, the rotating force of the drive motor 61 is transmitted to the rotary cylinder 24 and the ball spline 63a by the way of the drive pulley 62, the belt 64, and the driven pulley 63. The rotating force transmitted to the ball spline 63a is further transmitted to the center shaft 23. In this way, the center portion 21 and the ring portion 22 are rotated simultaneously.

The center shaft elevating mechanism 7 is arranged at a lower portion of the center shaft 23. The center shaft elevating mechanism 7 includes a cylinder 71, a movable block 73, and guide rails 74. The cylinder 71 is arranged in the vicinity of a lower end of the center shaft 23 and extends parallel with the axis of the center shaft 23. The cylinder 71 is provided with a cylinder rod 72 at an upper end thereof. The movable block 73 is coupled to an upper end of the cylinder rod 72. The guide rails 74 extend parallel with the axis of the center shaft 23 and guides the movement of the movable block 73.

The movable block 73 is coupled to the lower portion of the center shaft 23 by way of a bearing 73a. The cylinder 71 moves the movable block 73 up and down by the rod 72, and then moves the center shaft 23 up and down. The vertical movement of the center shaft 23 separates the center portion 21 from the ring portion 22 of the disk table 20, thereby making it easier to place and remove the substrate B on and from the center portion 21.

In the process of forming a thin film on the surface of a substrate B, the following operations are carried out. First, the cylinder system 53 is driven to move up the holder member 51 as shown in phantom lines in FIG. 2. The upward movement of the holder member 51 causes the square flange section 32b of the neck portion 32 to engage with the square hole 55 of the holder member 51, and consequently moves up the cover member 3.

In this state, the cylinder 71 is driven to move up the movable block 73, and the center shaft 23. The upward movement of the center shaft 23 elevates up the center portion 21 of the disk table 20, thereby protruding the center portion 21. This facilitates the setting of the substrate B on the center portion 21. The substrate setting is carried by an unillustrated robot arm or by a manual operation. The substrate B set on the center portion 21 is assuredly attracted to the center portion 21 by the air-suction by the unillustrated vacuum pump.

Subsequently, the center shaft 23 is moved down by the cylinder 71 to thereby bring the upper surface of the center portion 21 flush with the upper surface of the ring portion 22. Thereafter, a predetermined amount of applying liquid is dropped at a center of the substrate B.

The holder member 51 is moved down by the cylinder system 53 to close the disk table 20 by the cover member 3 to define a closed space S. It should be appreciated that the vacuum attraction of the substrate B to the upper surface of the center portion 21 is started immediately after the closed space S is defined by the cover member 3 and before the rotary member 2 is rotated.

After the closed space S is defined, the drive motor 61 of the rotary member driving mechanism 6 is rotated. The rotating force of the drive motor 61 is transmitted to the rotary cylinder 24 by the way of the drive pulley 62, belt 64, and driven pulley 63 to rotate the rotary cylinder 24 and the ring portion 22. At the same time, the rotating force is transmitted to the center shaft 23 by the way of the ball spline 63a to rotate the center shaft 23 and the center portion 21.

The high speed rotation of the center portion 21 and the ring portion 22 rotate the substrate B at the high speed, and spreads the drop of applying liquid over the surface of the substrate B by the centrifugal force to form a uniform thin film of applying liquid.

An excessive amount of applying liquid which has overflown from the surface of the substrate B is drained through the drainage hole 201 formed in the surrounding wall 22a of the rotary member 2, and introduced to the passage 401 through the hole 41 of the housing 4, and drained to the outside of the apparatus through the vertical hole 42.

After the elapse of a predetermined time, the driving of the drive motor 61 is stopped, and the short-stroke cylinder 532 and the long-stroke cylinder 531 are driven to move up the holder member 51 and the cover member 3 to open the space S. Thereafter, the cylinder 71 is driven to elevate up the center shaft 23 and the center portion 21. Consequently, the substrate B is elevated up from the rotary member 2 and is then picked up by the unillustrated robot arm or the like, and transported to a next production stage. These operations are repeated to produce a predetermined number of film coated substrates.

Figure 3:
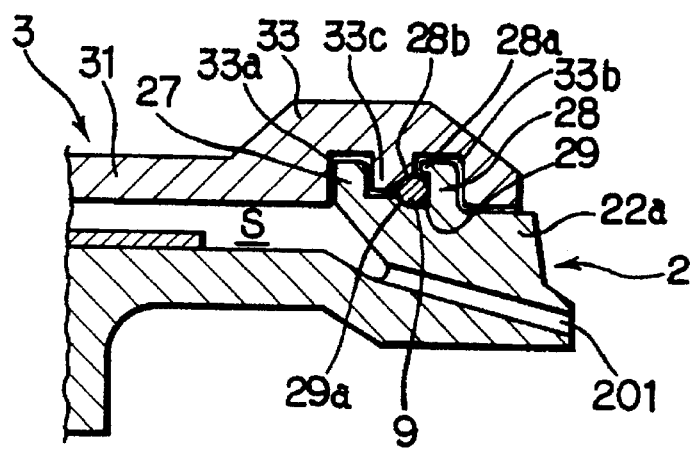
FIG. 3 is a cross sectional view showing a sealing arrangement of the liquid applying apparatus.

FIG. 3 is a sectional view showing a sealing arrangement to seal the closed space S which is adopted in the liquid applying apparatus. As shown in FIG. 3, an inner annular ridge 27 and an outer annular ridge 28 are formed on the top surface of the surrounding wall 22a. They are spaced from each other in a radial direction of the disk table 20 to define a sealing ring accommodation annular groove 29. The inner and outer annular ridges 27, 28 each have a rectangular section. The distance between the inner and outer annular ridges 27 and 28 is sufficiently greater than the diameter of a sealing ring 9 having a circular section.

The outer annular ridge 28 is formed with a flange 28a on an upper portion thereof. The flange 28a extends in an inward direction of the disk table 20, and has an slanting underside surface 28b.

The annular groove 29 is formed with a recess having a slanting surface 29a facing the slanting underside surface 28b of the flange 28a. The slanting underside surface 28b and the slanting surface 29a extend substantially in parallel with each other. In this way, the annular outer ridge 28, the flange 28b, and the recess formed in the annular groove 29 define a sealing ring accommodation space for partly accommodating a sealing ring 9 or O-ring. Also, the slanting underside surface 28b and the slanting surface 29a define an insertion opening of the sealing ring accommodation space. This insertion opening is greater than the diameter of the sealing ring 9.

The rim portion 33 of the cover member 3 is formed with an inner annular groove 33a and an outer annular groove 33b each having a rectangular shape in a radial section. The inner annular ridge 27 is placed in the inner annular groove 33a while the outer annular ridge 28 is placed in the outer annular groove 33b.

Figure 4:
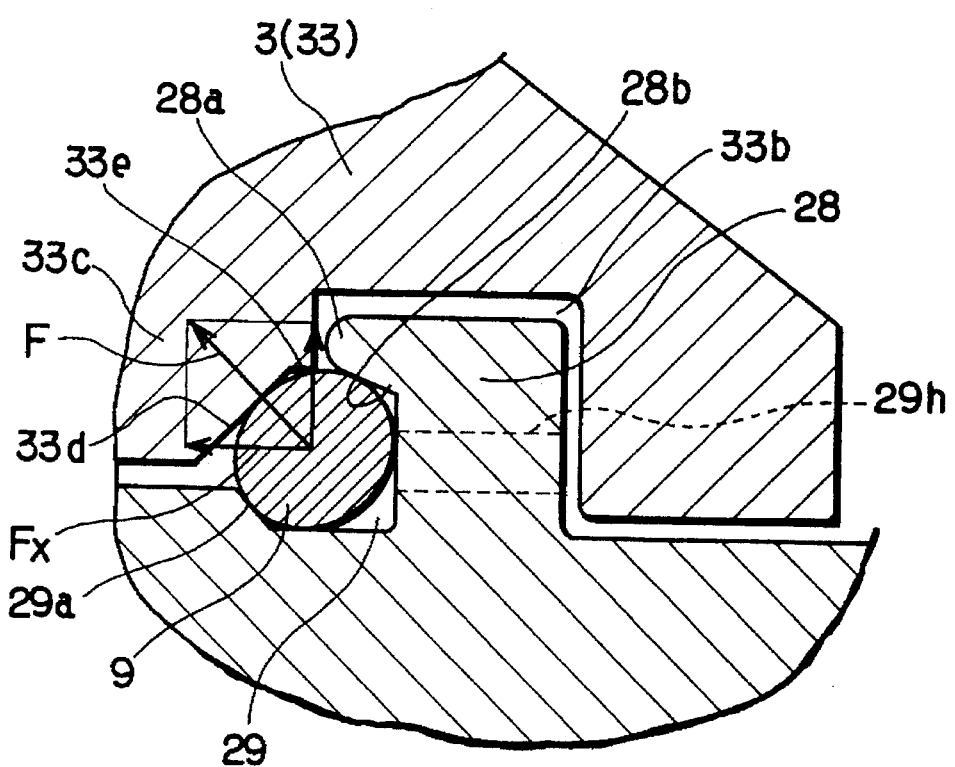
FIG. 4 is a partially enlarged view showing an essential part of the sealing arrangement.

The inner and outer annular grooves 33a and 33b define a sealing ring pressing annular ridge 33c between them. The annular ridge 33c is placed in the annular groove 29 between the inner and outer annular ridges 27 and 28. As shown in FIG. 4, the annular ridge 33c is formed with a contact surface facing the corner between the annular groove 29 and the outer annular ridge 28 when the cover member 3 is mounted on the disk table 20. The contact surface includes a slanting surface 33d and a horizontal surface 33e extending from an uppermost portion of the slanting surface 33d.

When the cover member 3 is mounted on the disk table 20, the slanting surface 33d and the horizontal surface 33e of the annular ridge 33c come into contact with the sealing ring 9 accommodated in the annular groove 29 to complete sealing of the closed space S. Also, the contact between the sealing ring 9 and the horizontal surface 33e of the annular ridge 33c keeps a constant distance between the surface of the substrate B and the underside surface of the cover member 3.

The outer annular ridge 28 is formed with one or more through holes 29h. The through hole 29h is used when removing the sealing ring 9. Specifically, a removing rod is inserted in the hole 29h from the outside and pushed inward to remove the sealing ring 9 from the accommodation space. This will facilitate the detachment of the sealing ring 9 from the disk table 20.

Attachment of the sealing ring 9 to the disk table 20 is carried out as follows. First, the sealing ring 9 is placed in the annular groove 29. The annular groove 29 has the greater width than the diameter of the sealing ring 9. Accordingly, the sealing ring 9 can be placed in the annular groove 29 easily without a careful attention. Thereafter, the cover member 3 is elevated down, the slanting surface 33d and the horizontal surface 33e formed in the cover member 3 come into pressing contact with the sealing ring, and push outward the sealing ring 9 to set it in the sealing ring accommodation space defined by the outer annular ridge 28 and the annular groove 29. In this way, the sealing ring 9 can be attached on the disk table 20 more easily than the conventional apparatus in which an sealing ring is forcibly fitted in the trapezoid hole.

Further, the flange 28a is formed on the upper portion of the outer annular ridge 28, which prevents the sealing ring 9 from displacing from the accommodation space. Specifically, the sealing ring 9 is prevented from being moved up together with the upward movement of the cover member 3 due to the fact that the sealing ring 9 has been made pressing contact with the contact surface of the annular ridge 33c for a long time, and adheres to the contact surface.

Further, even if the cover member 3 is moved down on the disk table 20 in a state of deflecting with respect to the axis of the rotary member 2, the sealing ring 9 will correct such deflection because the cover member 3 receives an elastic force of the sealing ring 9 at the slanting surface 33d as shown by the arrow F in FIG. 4. The elastic force F has a horizontal divided force shown by the arrow Fx. This horizontal divided force will correct a radial deflection of the cover member 3. Accordingly, a part of the cover member is assuredly prevented from striking the disk table 20 due to an imbalance in the centrifugal force when being rotated at the high speed. This will eliminate vibration of the cover member 3 and the disk table 20 which is likely to strip off dried matter from the wall of the cover member 3 and the disk table 20 and contaminate the applying liquid film being formed on the surface of the substrate B.

On the disk table 20 are formed two surrounding walls, i.e., the inner annular ridge 27 and the outer annular ridge 28. On the other hand, the rim portion 33 of the cover member 3 is formed with the inner and outer annular grooves 33a and 33b. When the cover member 3 is mounted on the disk table 20, the inner and outer annular grooves 33a and 33b of the cover member 3 respectively engage with the inner and outer annular ridges 27 and 28 to form a double rampart structure. This double rampart structure will more reliably prevent foreign minute dusts from coming into the closed space S from the outside.

According to the present invention, it may be appreciated to form inner and outer annular grooves in the disk table 20 while forming inner and outer annular ridges on the cover member 3 instead of the inner and outer annular ridges 27 and 28 formed in the disk table 20 and the inner and outer annular grooves 33a and 33b formed in the cover member 3.

Also, it may be appreciated to form only a sealing ring pressing annular ridge 33c on an underside surface of the cover member 3 without forming the inner and outer annular grooves 33a and 33b.

Further, it may be appreciated to form the contact surface formed on the underside of the annular ridge 33c into a curved surface following the surface of the sealing ring 9 to increase the contact area, instead of the straight slanting contact surface.

Further, the corner of the sealing ring accommodation space which is defined by the annular outer ridge 28 and the annular groove 29 may be shaped into a curved surface in correspondence with the round surface of the sealing ring.

Further, it may be appreciated to form the radial section of the annular ridges 27 and 28 and the annular grooves 33a and 33b into a round shape instead of the rectangular shape.

Moreover, the slanting surface 29a formed in the annular groove 29 may be omitted to reduce the production costs because the flange 28a prevents the sealing ring 9 from slipping out of the accommodation space.

Figure 5:
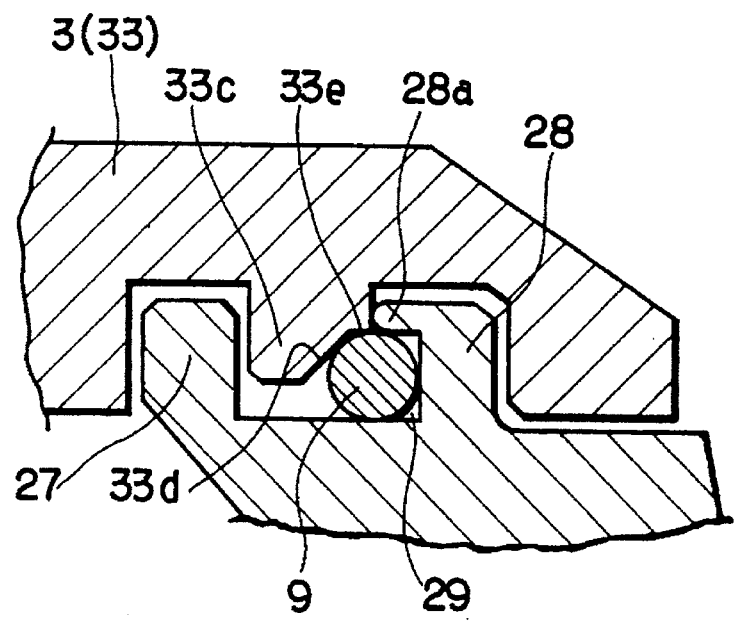
FIG. 5 is a cross sectional view showing a first modification of the sealing arrangement.

FIG. 5 is a cross sectional view showing a first modification of the sealing arrangement according to the present invention. The first modification is basically identical to the sealing arrangement of FIGS. 3 and 4 except that no recess is formed in the annular groove 29 between the inner annular ridge 27 and the outer annular ridge 28. Although the annular groove 29 is not formed with a recess, the sealing ring 9 can be assuredly held by the flange 28a formed on the upper portion of the outer annular ridge 28 and the contact surface formed on the underside of the annular ridge 33c.

Figure 6:
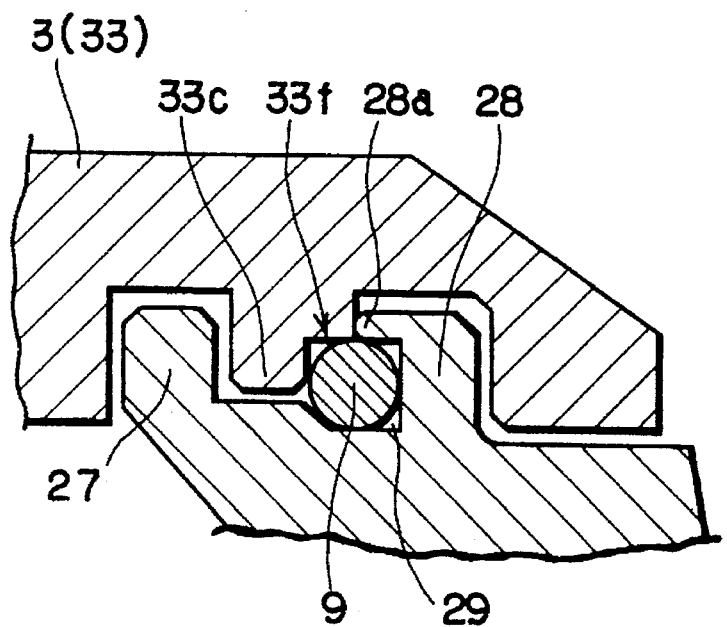
FIG. 6 is a cross sectional view showing a second modification of the sealing arrangement.

FIG. 6 is a cross sectional view showing a second modification of the sealing arrangement. The second modification is basically identical to the sealing arrangement of FIGS. 3 and 4 except that a sealing ring pressing annular ridge 33c of the cover member 3 is formed with a stepped portion 33f. The stepped portion 33f includes a vertical surface and a horizontal surface. With this arrangement, when the cover member 3 is mounted on the disk table 20, the vertical and horizontal surfaces of the stepped portion 33f come into pressing contact with the surface of the sealing ring 9.

Figure 7:
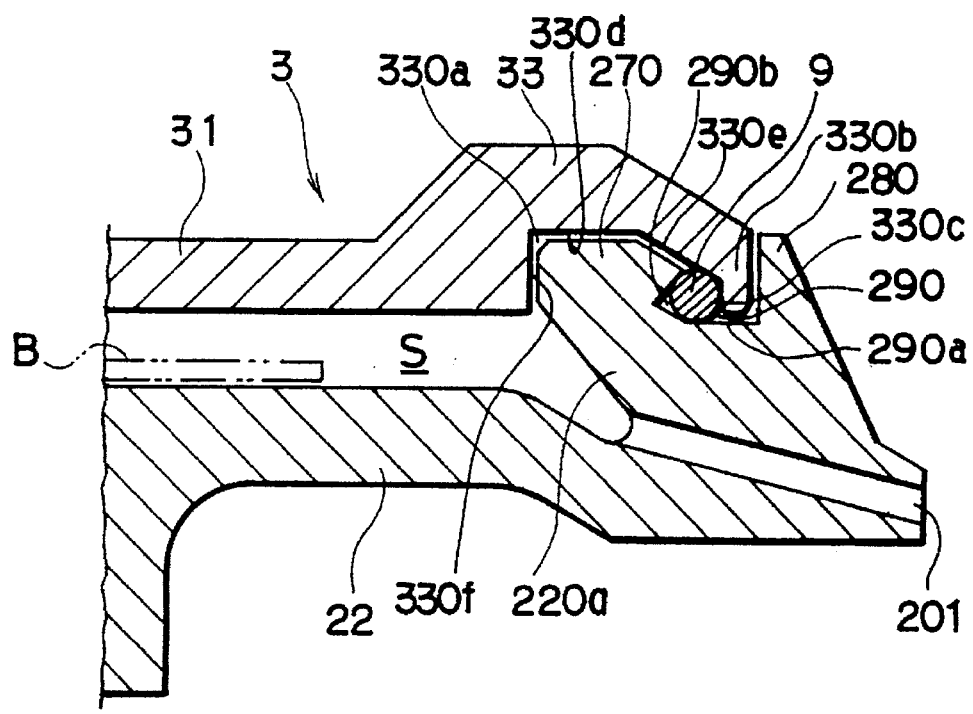
FIG. 7 is a cross sectional view showing a third modification of the sealing arrangement.

FIG. 7 is a cross sectional view showing a third modification of the sealing arrangement. A rotary member 2 is formed with a surrounding wall 220a on a periphery thereof. The surrounding wall 220a is formed with an inner annular ridge 270 and an outer annular ridge 280 on a top surface thereof. The inner and outer annular ridges 270, 280 are formed into a generally rectangular shape in a radial section, and spaced from each other in a radial direction of the rotary member 2 to define a sealing ring accommodation annular groove 290 between them. The annular groove 290 has a width greater than the diameter of the sealing ring 9 and a flat bottom surface 290a.

The inner annular ridge 270 is formed with a wedge-like groove 290b in an outer periphery thereof. A lower surface of the wedge-like groove 290b is connected with the bottom surface 290a. A sealing ring 9 is placed in the wedge-like groove 290b. In the state where the sealing ring 9 is placed in the wedge-like groove 290b, there is a space between an outermost circumferential surface of the sealing ring 9 and an inner surface of the outer annular ridge 280. The largest opening of the wedge-like groove 290b is generally equal to the diameter of the sealing ring 9.

In the state where the sealing ring 9 is placed in the wedge-like groove 290b, an inner half portion of the sealing ring 9 is in the wedge-like groove 290b while the remaining outer half portion is out of the wedge-like groove 290b.

A rim portion 33 of a cover member 3 is formed with an annular groove 330a in an underside thereof. The annular groove 330a engages with the annular ridge 270 when the cover member 3 is mounted on the disk table 20. The rim portion 33 is further formed with a sealing ring pressing annular ridge 330b at an outermost periphery thereof. The annular ridge 330b is inserted in the space in the annular groove 290 which is defined by the sealing ring 9 and the outer annular ridge 280. The annular groove 330a has an outer vertical surface 330c, slanting surface 330e, horizontal surface 330d, and inner vertical surface 330f.

When the cover member 3 is mounted on the disk table 20, the outer side of the sealing ring 9 placed in the wedge-like groove 290b is brought into pressing contact with the outer vertical surface 330c and the slanting surface 330e. Consequently, the sealing ring 9 is assuredly fitted in the wedge-like groove 290b with a reduced deformation of the sealing ring 9.

Attachment of the sealing ring 9 on the wedge-like groove 290b is as follows. First, a part of the sealing ring 9 is placed in the annular groove 290 and the entirety of the sealing ring 9 is placed in the annular groove 290 having the width greater than the diameter of the sealing ring 9 by expanding the sealing ring 9. Thereafter, the sealing ring 9 contracts to the wedge-like groove 290b owing to the elasticity of the sealing ring 9. Accordingly, the sealing ring 9 can be attached on the wedge-like groove 290b more smoothly and easily.

Also, the sealing ring 9 is fitted in the wedge-like groove 290b like a band wound around the wedge-like groove 290b. Accordingly, even if the sealing ring 9 adheres to the slanting surface 330e and the outer vertical surface 330c of the cover member 3 due to the long contact, the upper side of the wedge-like groove 290b prevents the sealing ring 9 from being slipped out of the wedge-like groove 290b by the upward movement of the cover member 3.

Further, the resilient force of the sealing ring 9 fitted in the wedge-like groove 290b will correct a radial deflection of the cover member 3 at the contact between the sealing ring 9 and the outer vertical surface 330c of the annular ridge 330b of the cover member 3, thereby preventing the cover member 3 and the rotary member 2 from hitting each other to cause vibration.

Figure 8:
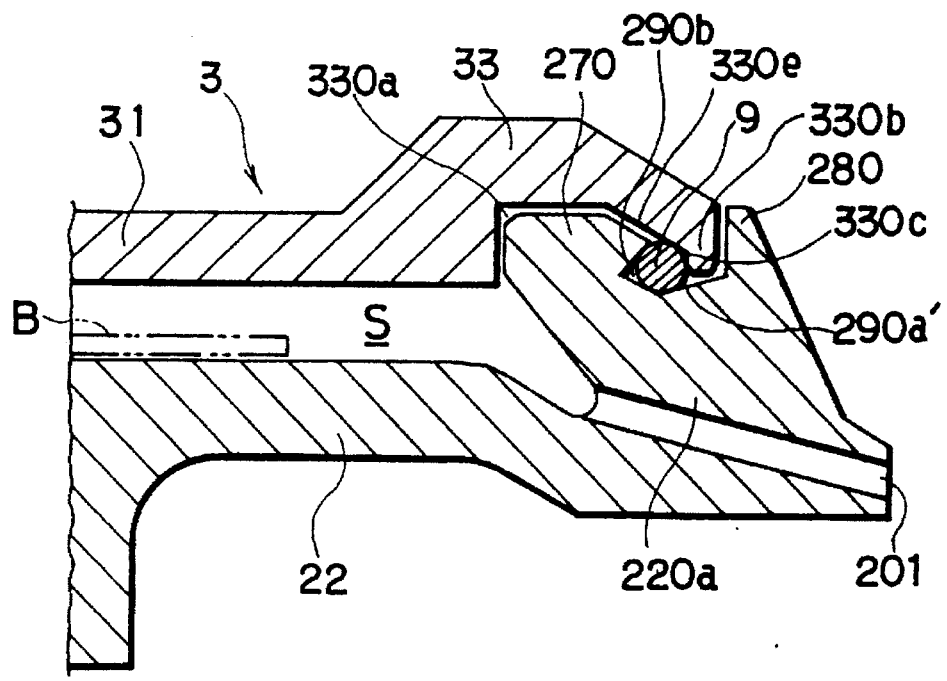
FIG. 8 is a cross sectional view showing a fourth modification of the sealing arrangement.

FIG. 8 is a cross sectional view showing a fourth modification of the sealing arrangement. The fourth modification is basically identical to the third modification of FIG. 7 except that a sealing ring accommodation annular groove 290 is formed with a slanting bottom surface 290a' instead of the flat bottom surface 290a. The slanting surface 290a' introduces the sealing ring 9 toward the wedge-like groove 290b, and thus improves the reliability of fitting of the sealing ring 9 in the wedge-like groove 290b.

Figure 9:
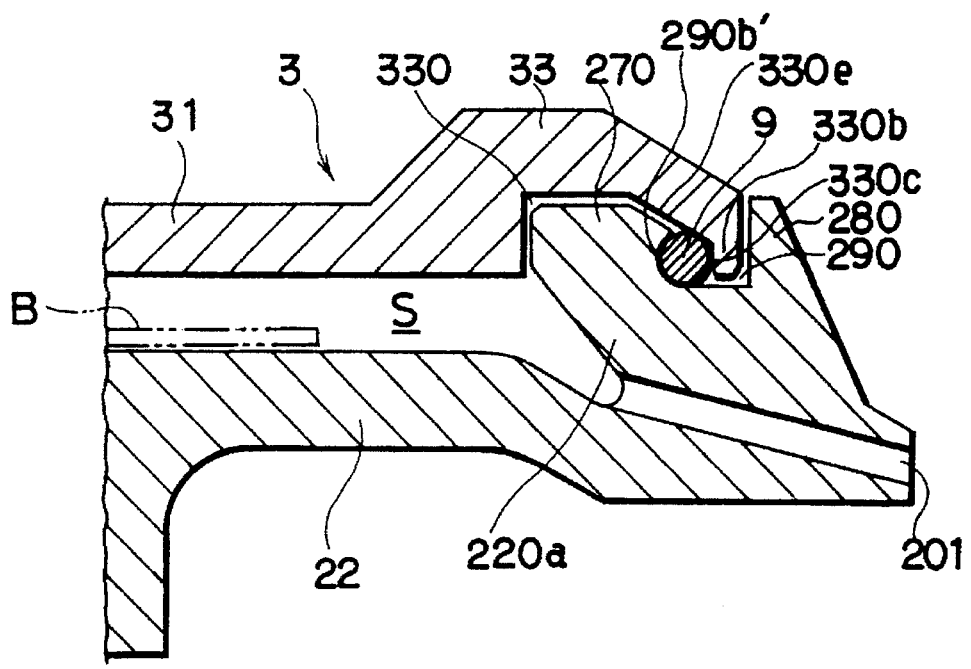
FIG. 9 is a cross sectional view showing a fifth modification of the sealing arrangement.

FIG. 9 is a cross sectional view showing a fifth modification of the sealing arrangement. The fifth modification is basically identical to the third modification of FIG. 7 except that an inner annular ridge 270 is formed with a round groove 290b' instead of the wedge-like groove 290b. It will be preferable that the round groove 290b' has a curvature identical to the surface of the sealing ring 9.

The round groove 290b' fitting the surface of the sealing ring 9 will eliminate deformation of the sealing ring 9 when a sealing ring pressing annular ridge 330b of the cover member 3 is placed in a sealing ring accommodation annular groove 290 and generate greater resilient force to correct radial deflection.

Figure 10:
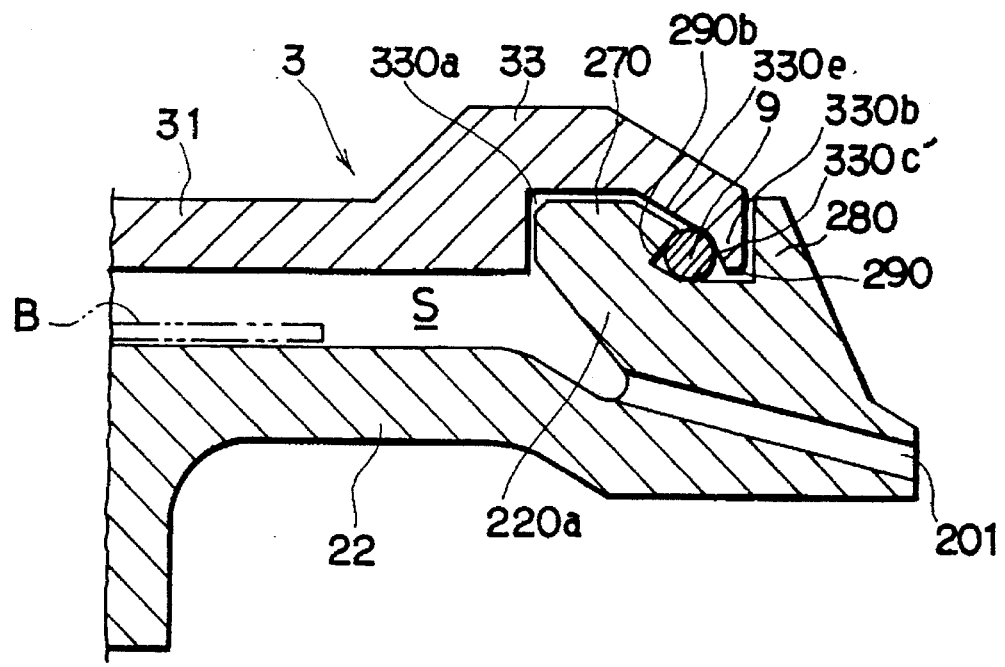
FIG. 10 is a cross sectional view showing a sixth modification of the sealing arrangement.

FIG. 10 is a cross sectional view showing a sixth modification of the sealing arrangement. The sixth modification is basically identical to the third modification of FIG. 7 except that a slanting surface 330c' is formed on a sealing ring pressing annular ridge 330b in stead of the outer vertical surface 330c. The slanting surface 330c' will make more smooth the mounting of the cover member 3 or inserting of the annular ridge 330c in the annular groove 290.

It may be appreciated that a round surface is formed in an underside of the annular ridge 330c instead of the slanting surfaces 330e and 330c'.

Figure 11:
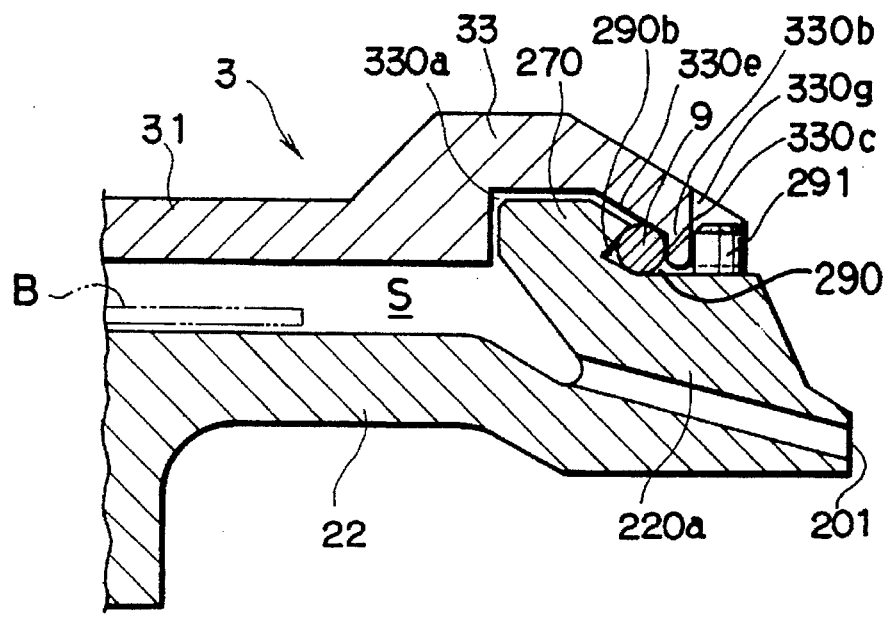
FIG. 11 is a cross sectional view showing a seventh modification of the sealing arrangement.

FIG. 11 is a cross sectional view showing a seventh modification of the sealing arrangement. The seventh modification is basically identical to the third modification of FIG. 7 except that instead of the outer annular ridge 280, several standing pins 291 are provided at an outer periphery on the top surface of the surrounding wall 220a. An annular ridge 330c of the cover member 3 is placed in a space between the standing pins 291 and the sealing ring 9 fitted in a wedge-like groove 290b.

In a periphery of the cover member 3 are formed recesses 330g to be engaged with the standing pins 291. These recesses 330g are adapted for restricting the cover member 3 from shifting in a circumferential direction thereof when being rotated at the high speed. The engagement of the recesses 330g with the standing pins 291 assures the integral rotation of the rotary member 2 and the cover member 3.

Figure 12:
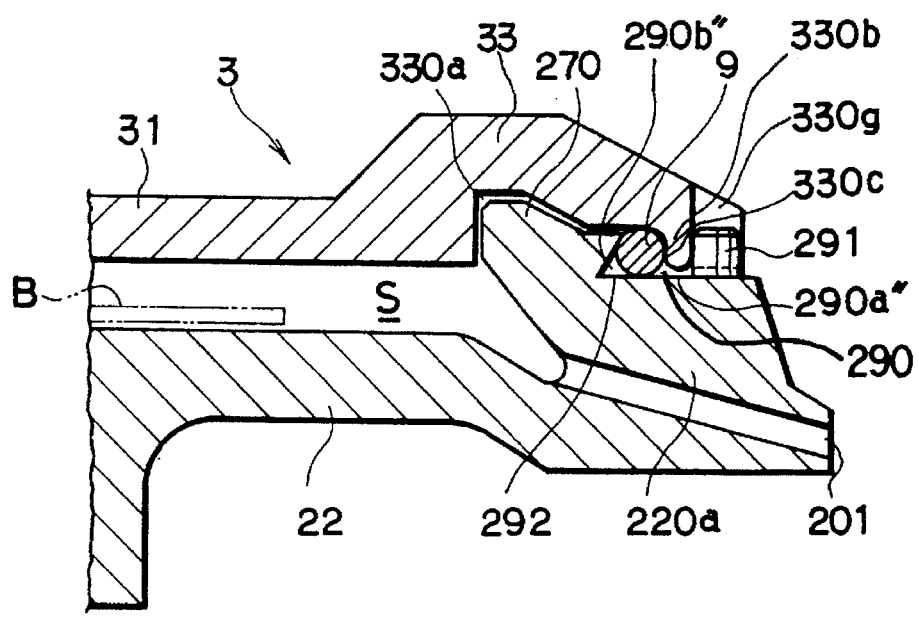
FIG. 12 is a cross sectional view showing a eighth modification of the sealing arrangement.

FIG. 12 is a cross sectional view showing an eighth modification of the sealing arrangement. The eighth modification is basically identical to the seventh modification except that there is formed a wedge-like groove 290b" whose lower side surface 292 is flush with a bottom surface of a sealing ring accommodation annular groove 290 instead of the V-shaved wedge-like groove 290b.

Figure 13:
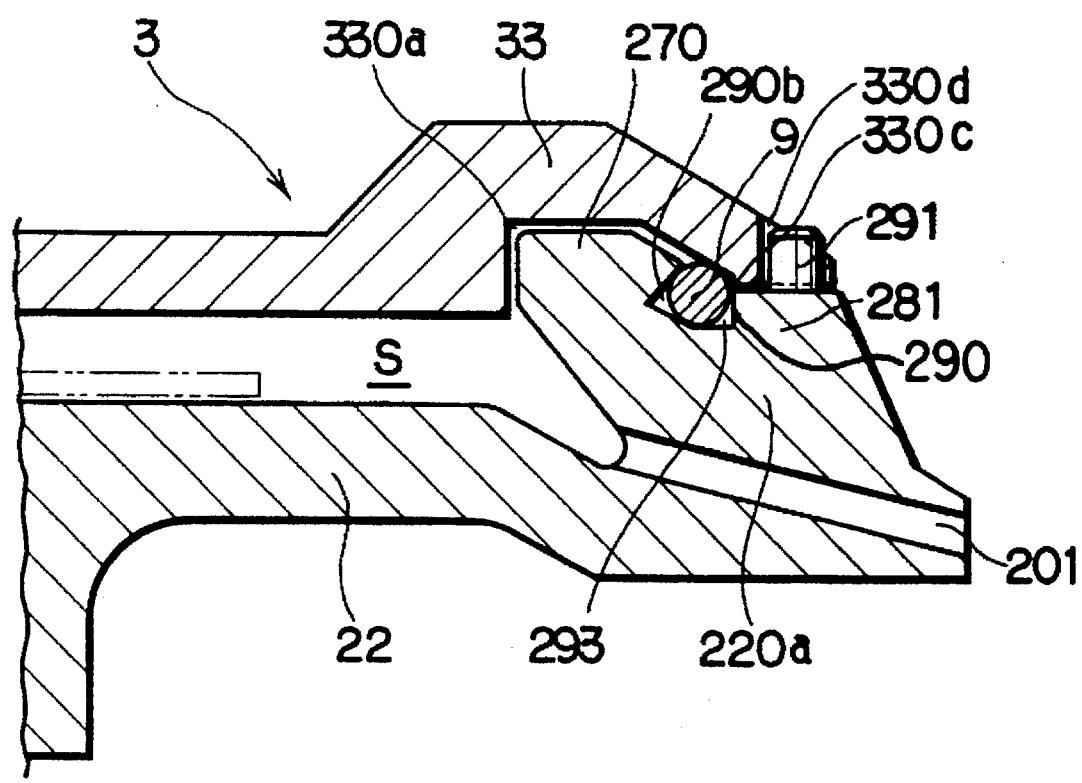
FIG. 13 is a cross sectional view showing a ninth modification of the sealing arrangement.

FIG. 13 is a cross sectional view showing a ninth modification of the sealing arrangement. The ninth modification is basically identical to the seventh modification except that an outer annular ridge 281 is formed in an upper portion of a surrounding wall 220a and that standing pins 291 is provided on a top surface of the outer annular ridge 281. The height of the outer annular ridge 281 from a bottom surface 293 of a sealing ring accommodation annular groove 290 to the top surface of the outer annular ridge 281 is slightly larger than the radius of the sealing ring 9. However, the insertion opening of the annular groove 290 which is defined by an upper edge of the wedge-like groove 290b and an inner top edge of the outer annular ridge 281 is larger than the diameter of the sealing ring 9. The outer annular ridge 281 keeps the sealing ring 9 from expanding radially outward due to the centrifugal force.

Figure 14:
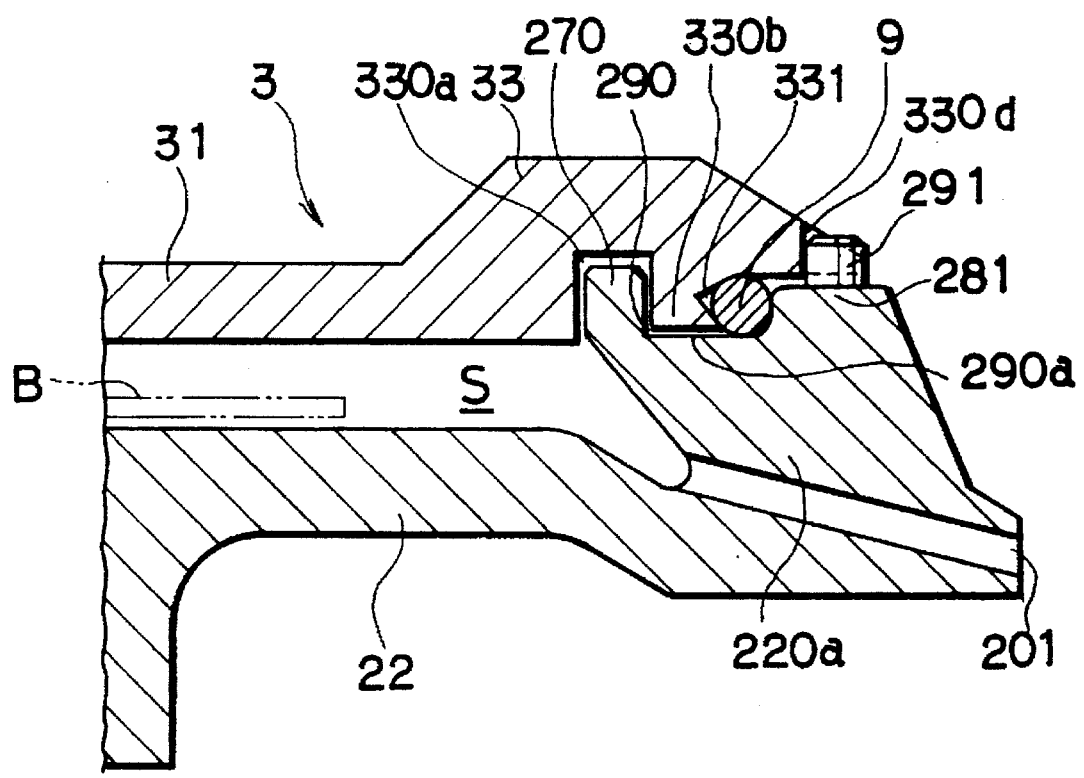
FIG. 14 is a cross sectional view showing a tenth modification of the sealing arrangement.

FIG. 14 is a cross sectional view showing a tenth modification of the sealing arrangement. The tenth modification is basically identical to the ninth modification except that a wedge-like groove 331 is formed on a cover member 3, not on a rotary member 2. Specifically, an annular ridge 330b of the cover member 3 is formed with a wedge-like annular groove 331.

A rim portion 33 of a cover member 3 is formed with an inner annular groove 330a and restricting recesses 330d in a periphery thereof. The inner annular groove 330a engages with an inner annular ridge 270. The recesses 330d engage with standing pins 291.

The sealing ring 9 is attached on the wedge-like groove 330b formed in the cover member 3. Accordingly, the rotary member 2 can be rotated at a high speed without the likelihood of radial expansion of the sealing ring to dry the substrate B in an opened space. In this modification, the outer annular ridge 281 serves as the sealing ring pressing ridge.

It should be noted that in the tenth modification, a round groove may be formed instead of the wedge-like groove 331. Further, a corner portion defined by the inner surface of the annular ridge 281 and the bottom surface 290a of the annular groove 290 may be formed into a round surface following the surface of the sealing ring 9.

Further, in the fifth to sixth modifications shown in FIGS. 9 to 10, the bottom surface of the annular groove 290 may be formed into a slanting surface as the slanting surface 290a' of the fourth modification of FIG. 8.

Further, the round groove 290b' of the fifth modification of FIG. 9 may be formed into a flat surface or a polygonal surface in a radial section.

Next, the positioning of the cover member 3 with respect to the rotary member 2 will be described in more detail with reference to FIGS. 15 to 17.

Figure 15:
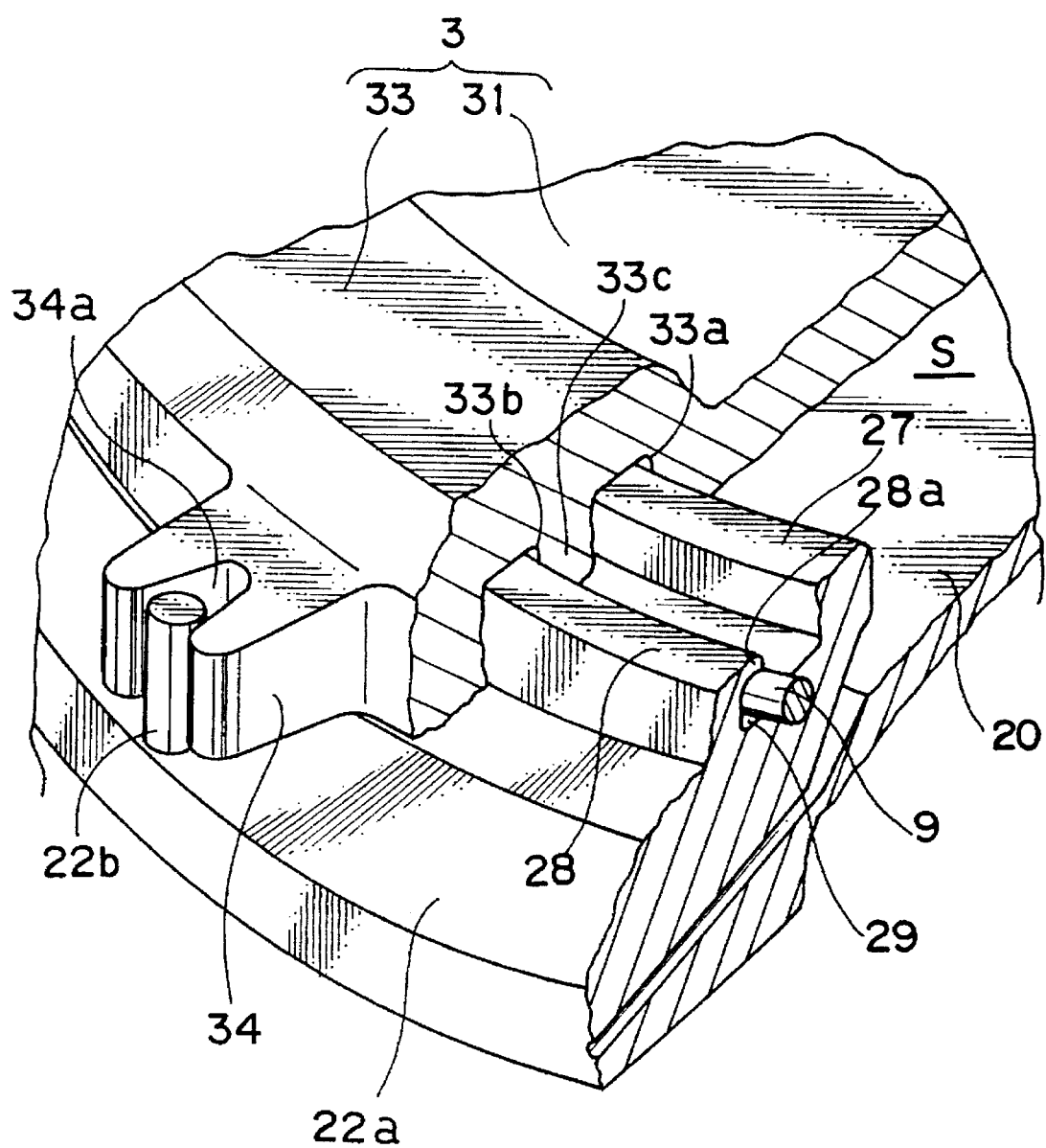
FIG. 15 is a partially cutaway enlarged perspective view showing a restricting arrangement for restricting a cover member from shifting in a circumferential direction thereof relative to the disk table.

FIG. 15 is a partially enlarged cutaway perspective view showing a restricting arrangement for restricting the cover member 3 from shifting in a circumferential direction relative to the rotary member 2 when they are rotated at the high speed. FIGS. 16 and 17 are partially cutaway perspective views showing a connecting arrangement for connecting the cover member 3 with the holder member 51.

FIG. 15 shows the state where the cover member 3 is mounted on the disk table 20. The cover member 3 is formed with a fork portion 34 at a specified position of the periphery thereof. The fork portion 34 has two fingers projecting radially outward which defines a fitting space 34a.

The disk table 20 is provided with a standing pin 22b on an outermost periphery portion thereof. The standing pin 22b engages with the fitting space 34a of the fork portion 34 of the cover member 3 when the cover member 3 is mounted on the disk table 20, and prevents the cover member 3 from shifting in the circumferential direction relative to the disk table 20 when the rotary member 2 and the cover member 3 are integrally rotated at the high speed.

Figure 16:
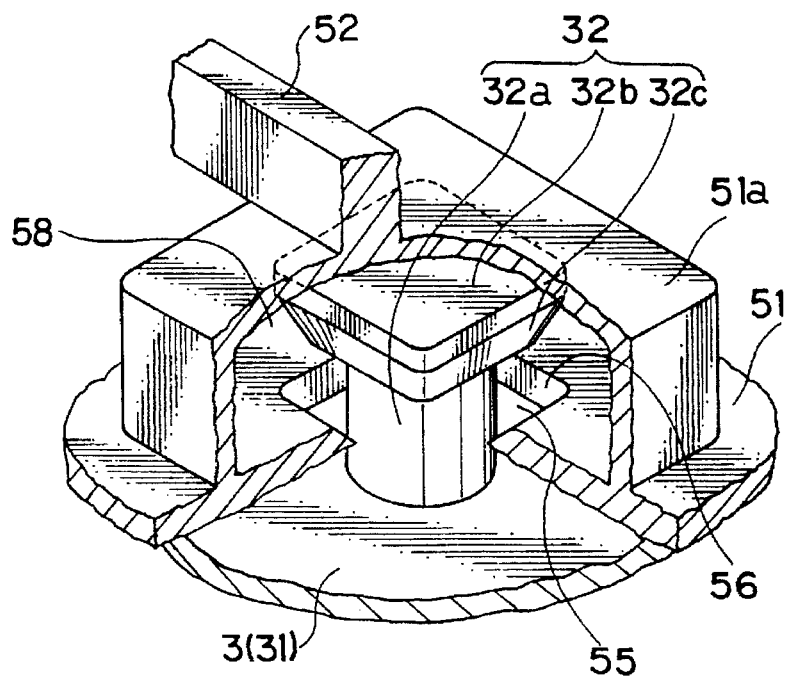
FIG. 16 is a partially cutaway enlarged perspective view showing an operative state of a connecting arrangement between the cover member and a holder member of the liquid applying apparatus, the cover member being allowed to rotate independently from the holder member.
Figure 17:
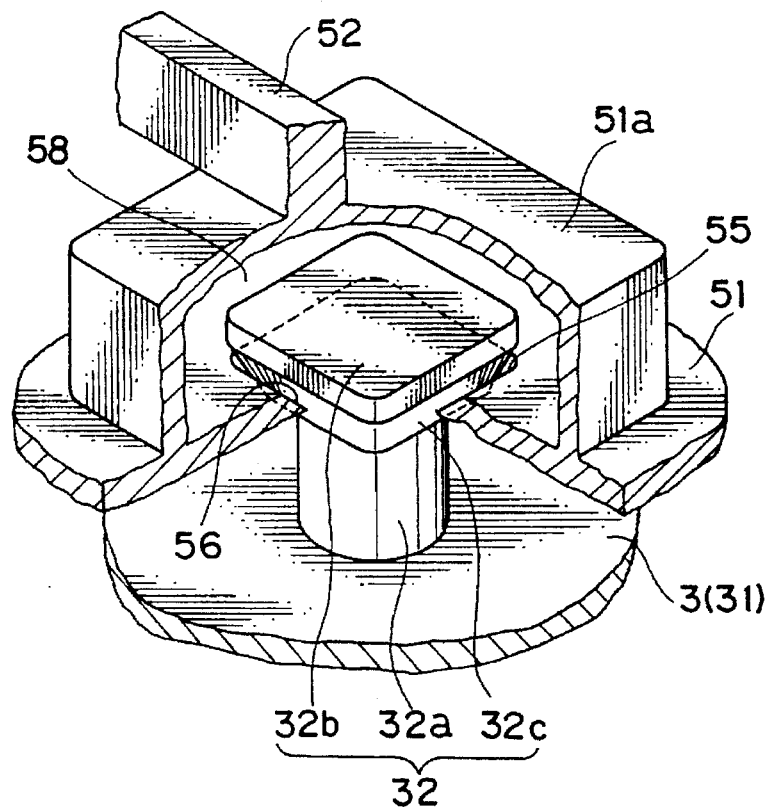
FIG. 17 is a partially cutaway enlarged perspective view showing another operative state of the connecting arrangement, the cover member being kept from rotating.

FIG. 16 illustrates the state of the connecting arrangement where the holder member 51 is elevated down to allow the cover member 3 to rotate together with the rotary member 2. FIG. 17 illustrates the state of the connecting arrangement where the holder member 51 is elevated up to move up the cover member 3.

The neck portion 32 provided on the center of the cover member 3 is formed with the cylindrical stem section 32a and the square flange section 32b as mentioned earlier. The square flange section 32b is formed with four slanting side surfaces 32c.

The holder member 51 is formed with the square hole 55 in the center portion. The square hole 55 has a size smaller than the square flange section 32b but greater than the diameter of the cylindrical stem section 32a. The square hole 55 is formed with four slanting inner surfaces 56. The slanting inner surfaces 56 come into contact with the slanting side surfaces 32c of the square flange section 32b when the holder member 51 is moved up.

The neck portion 32 is made to have such a height as to render the square flange section 32b of the neck portion 32 apart away from the square hole 55 of the holder member 51 and to allow the cover member 3 to rotate independently from the holder member 51 when the holder member 51 is mounted on the top surface of the housing 4. The inside space 58 formed in the boss portion 51a has a sufficient size to permit the square flange section 32b to move and rotate freely.

Accordingly, when the holder member 51 is placed on the top surface of the housing 4 to define the closed space S by the cover member 3, the square flange section 32b of the neck portion 32 moves apart from the square hole 55 of the holder member 51, and the cover member 3 can rotate free from the holder member 51.

Conversely, the holder member 51 is elevated up by the elevating mechanism, the square hole 55 of the holder member 51 engages with the square flange section 32b with the slanting inner surfaces 56 coming into contact with the slanting side surfaces 32c. The subsequent upward movement of the holder member 51 moves up the cover member 3, thereby opening the space S.

The cover member 3 is mechanically connected with the holder member 51 by the engagement of the square flange section 32b and the square hole 55. This will assuredly correct a possible deflection of the cover member 3 with respect to the disk table 20. In other words, the cover member 3 can be mounted on the disk table 20 easily with the axis of the cover member 3 aligning with the axis of the disk table 20.

As mentioned above, when the holder member 51 is moved up to uncover the disk table 20, the slanting side surfaces 32c of the square flange section 32b slidingly come into contact with the slanting inner surfaces 56 of the hole 55 of the holder member 51, thereby correcting a deflection of the cover member 3 with respect to the disk table 20. On the other hand, when the holder member 51 is moved down to close the disk table 20, the cover member 3 can be easily set on the disk table 20 coaxially with each other. This will reliably eliminate the likelihood that the cover member 3 is eccentrically rotated. Also, this will facilitate the engagement of the fitting space 34a of the fork portion 34 with the standing pin 22b in the restricting arrangement.

In the foregoing embodiment, there are provided the square flange section 32b and the square hole 55. However, the shape of flange section 32b of the neck portion 32 and hole 55 of the holder member 51 are not limited into a square. The flange section 32b and the hole 55 may be shaped into a polygonal shape. Also, the flange section 32b and the hole 55 may be shaped into an ellipse or a semicircle partially having a straight portion.

According to the present invention, furthermore, there are variations of the connecting arrangement as shown FIGS. 18A to 18D. It should be noted that the reference numerals identical to those in the previously mentioned connecting arrangement are used in these variations.

Figure 18A:
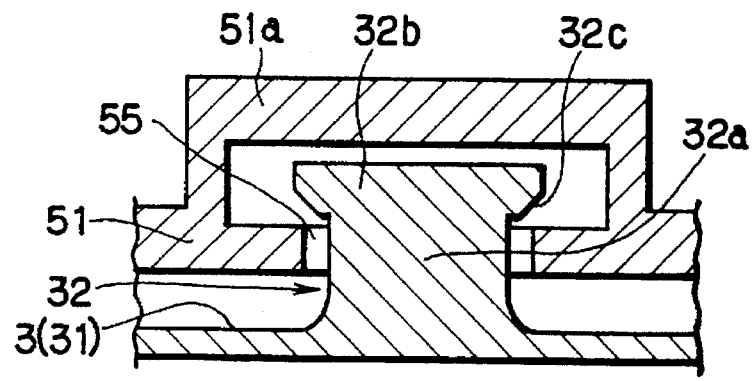
FIGS. 18A to 18D are cross sectional views showing first to fourth variations of the connecting arrangement, respectively.

A first variation is shown in FIG. 18A. The first variation is identical to the connecting arrangement of FIGS. 16 and 17 except that inner walls of a square hole 55 have no slating surface but a straight surface. In this variation, the slanting side surfaces 32c come into contact with upper edges of the straight inner wall of the square hole 55 to complete the connection engagement.

Figure 18B:
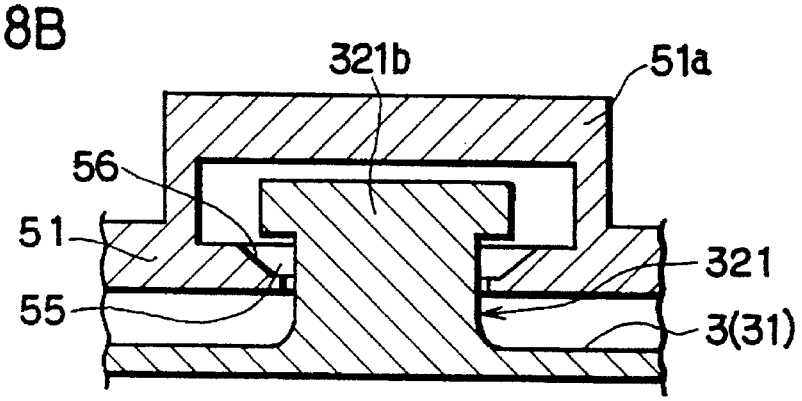

A second variation is shown in FIG. 18B. The second variation is identical to the connecting arrangement of FIGS. 16 and 17 except that a square flange section 321b is formed with no slanting side surfaces but with straight side surfaces. In this variation, the straight side surfaces of the square flange section 321b come into contact with the slanting inner surfaces 56 of the square hole 55 to complete the connection engagement.

Figure 18C:
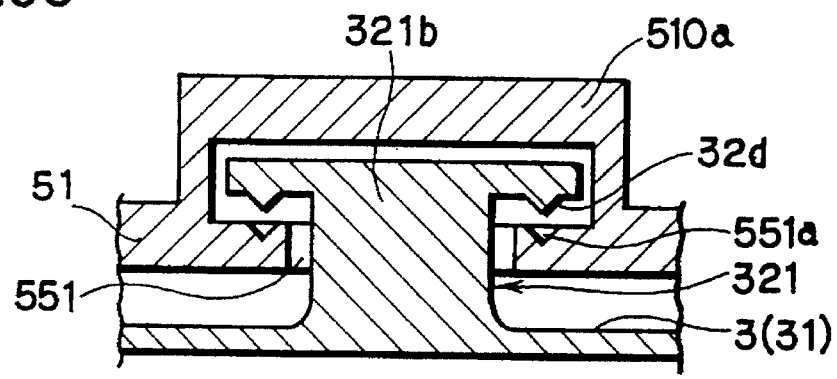

A third variation is shown in FIG. 18C. The third variation is identical to the connecting arrangement of FIGS. 16 and 17 except that a square flange section 321b is formed with no slanting side surfaces but with projections 32d on an underside of the flange section 321b, and a square hole 551 is not formed with slanting inner surfaces but recesses 551a in a bottom surface of a boss portion 510a. When the holder member 51 is moved up, the projections 32d of the square flange section 321b engage with the recesses 551a formed in the boss portion 510a.

Figure 18D:
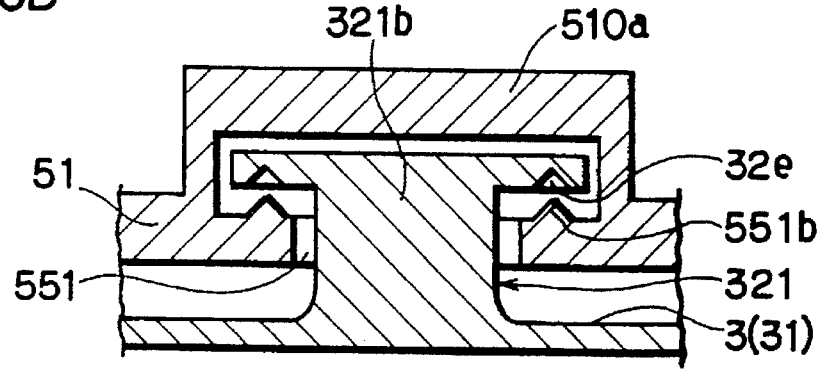

A fourth variation is shown in FIG. 18D. The fourth variation is identical to the third variation except that projections 551b are formed on a bottom surface of a boss portion 510a while recesses 32e are formed in an underside of a square flange section 321b.

Figure 19:
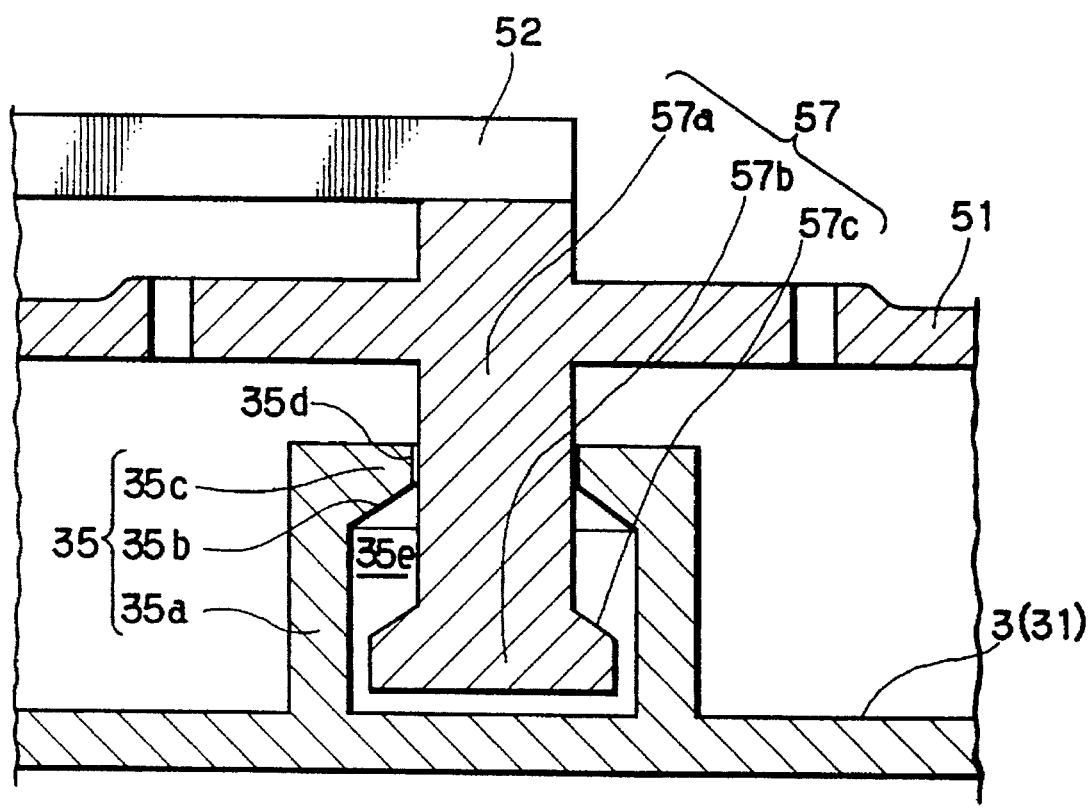
FIG. 19 is an enlarged cross sectional view showing an operative state of another connecting arrangement between the cover and holder members.
Figure 20:
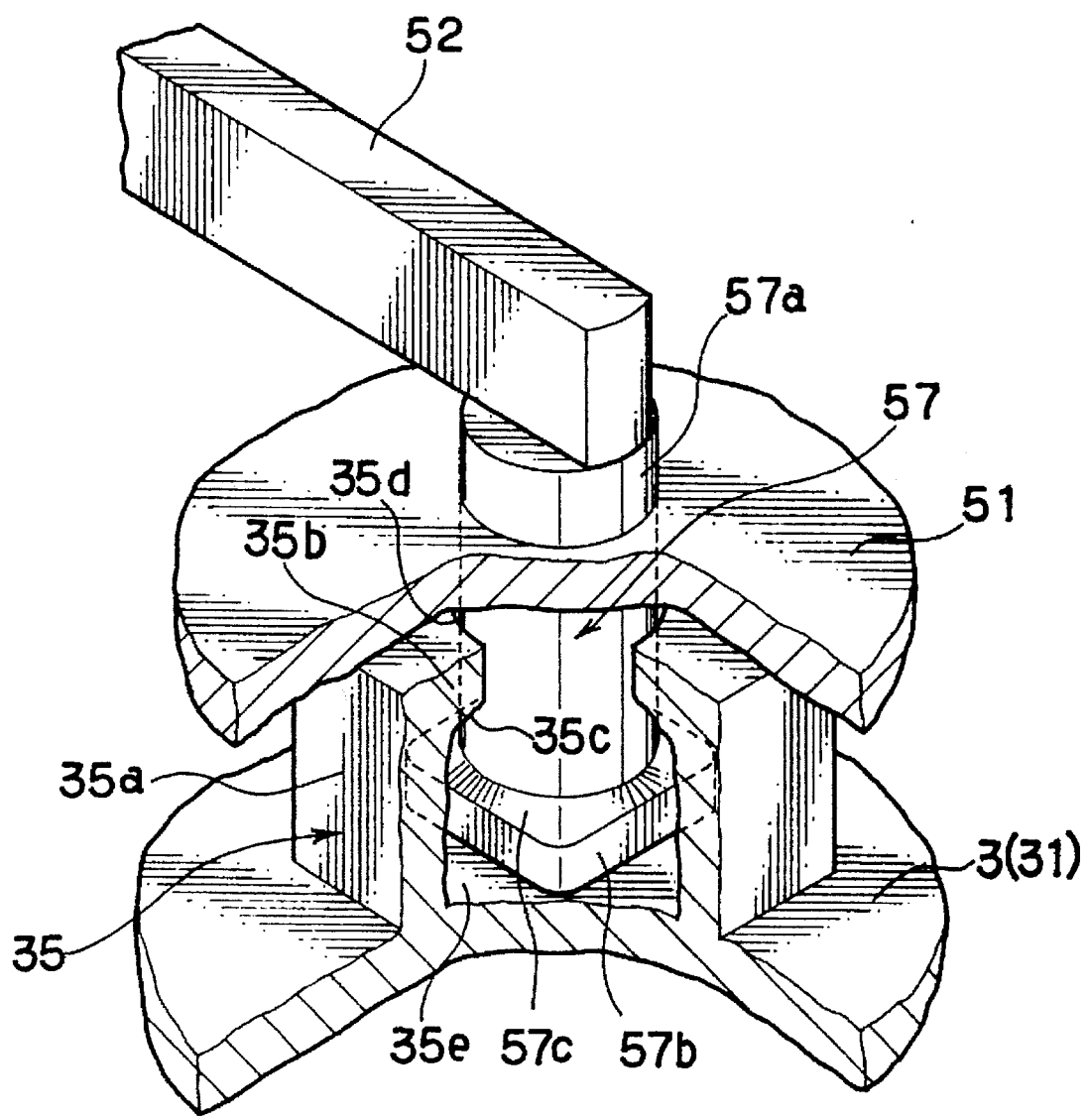
FIG. 20 is a partially cutaway enlarged perspective view showing the connecting arrangement of FIG. 19.

Next, another connecting arrangement according to the present invention will be described with reference to FIGS. 19 and 20. FIG. 19 is a cross sectional view showing another connecting arrangement, and FIG. 20 is a partially cut-away perspective view of this connecting arrangement. It should be noted that parts identical to those in the previously mentioned connecting arrangement are indicated at the same reference numerals in this connecting arrangement.

In this connecting arrangement, a cover member 3 is formed with no neck portion but with a boss portion 35, and a holder member 51 is formed with no boss portion but with a hanger portion 57.

The hanger portion 57 has a cylindrical stem section 57a, and a flange section 57b at a lower end of the cylindrical stem section 57a. The flange section 57b is shaped into a square. The square flange section 57b is formed with slanting upper surfaces 57c.

The boss portion 35 is in the form of a box and side walls 35a and a top wall 35c. The boss portion 35 is formed with a space 35e for accommodating the square flange section 57b of the hanger portion 57. A horizontal section of the accommodation space 35e is in the form of a square. The top wall 35c is formed with a hole 35d at a center thereof. The hole 35d has a diameter larger than an outer diameter of the cylindrical stem section 57a of the hanger portion 57. The boss portion 35 is further formed with slanting surfaces 35b. The slanting surfaces 35b corresponds to the slanting surfaces 57c of the hanger portion 57.

When the holder member is mounted on the top surface of the housing 4, the slanting surfaces 57c of the square flange section 57b is apart from the slanting surfaces 35b of the boss portion 35.

When the holder member 51 is elevated up, the slanting surfaces 57c of the hanger portion 57 slidingly come into contact with the slanting surfaces 35b of the boss portion 35. As the holder member 51 is further elevated up, the cover member 3 is moved up accompanied by the upward movement of the holder member 51 to uncover the disk table 20. The engagement of the square flange section 57b of the hanger portion 57 and the slanting surfaces 35b defining the square space will correct a deflection of the cover member with respect to the disk table 20.

In this connecting arrangement, the slanting surfaces 57c are formed on the square flange section 57b and the slanting surfaces 35b are formed on the upper portion of the square accommodation space 35e. However, the shape of these portions are not limited to a square, but may be possible into a polygonal shape, ellipse or a semicircle partially having a straight portion.

Although not illustrated, it should be noted that the structural feature of the first to fourth connecting arrangement variations shown in FIGS. 18A to 18D may be applicable in this connecting arrangement.

As the present invention may be embodied in several forms without departing from the spirit of essential characteristics thereof, the present embodiment is therefore illustrative and not restrictive, since the scope of the invention is defined by the appending claims rather than by the description preceding them, and all changes that fall within meets and bounds of the claims, or equivalence of such meets and bounds are therefore intended to be embraced by the claims.

What is claimed is:

1. A liquid applying apparatus comprising:

a rotary member having a disk table in which a substrate to be applied with liquid is placed;

a driving mechanism which drives the rotary member about a rotary axis at a high speed;

a cover member movable above the disk table and operable to define a closed space in combination with the disk table;

an elevating mechanism which elevates the cover member up and down in a direction parallel to said rotary axis;

a sealing arrangement provided between the disk table and the cover member to seal the dosed space, the sealing arrangement including:

a resilient sealing ring having a cross sectional size;

a ring accommodation annular groove formed in either a top surface of a periphery of the disk table or an underside surface of a periphery of the cover member, the ring accommodation annular groove having a cross sectional size greater than the cross sectional size of the sealing ring and being operable to accommodate the sealing ring, said groove having an outer inside surface and a flange extending radially inwardly from an upper portion of said outer inside surface for retaining the sealing ring in said groove;

a ring pressing annular ridge formed on either a top surface of a periphery of the disk table or an underside surface of a periphery of the cover member, the ring pressing annular ridge having a cross sectional size smaller than the cross sectional size of the ring accommodation annular groove, the ring pressing annular ridge being engageable with the ring accommodation annular groove and coming into contact with the sealing ring to press the sealing radially outwardly against the outer inside surface of the ring accommodation annular groove in a position underlying said flange when the cover member is combined with the disk table;

whereby the ring pressing member is operable to facilitate installation of the sealing ring in said groove as said ring pressing member moves downwardly to press said sealing ring radially outwardly toward said outer inside surface of said groove and said flange is operable to retain said sealing ring in said groove as said ring pressing member repeatedly moves up and down and repeatedly presses said sealing ring.

2. A liquid applying apparatus as defined in claim 1, wherein:

the ring accommodation annular groove is defined by an inner annular ridge and an outer annular ridge formed on the top surface of the disk table; and the ring pressing annular ridge is defined by an inner annular groove and an outer annular groove formed in the underside surface of the cover member, the inner and outer annular groove being engageable with the inner and outer annular ridges formed on the disk table.

3. A liquid applying apparatus as defined in claim 2, wherein:

the ring pressing annular ridge formed on the cover member has an end portion insertable in a space between the inner annular ridge and the sealing ring;

whereby the insertable end portion of the ring pressing annular ridge pushes the sealing ring toward the outer inside surface of said groove when the cover member is combined with the disk table.

4. A liquid applying apparatus as defined in claim 3, wherein the end portion of the annular ridge is formed with a slanting surface for pushing the sealing ring toward the outer inside surface of said groove.

5. A liquid applying apparatus as defined in claim 4, wherein the end portion of the annular ridge is further formed with a horizontal surface for pushing down the sealing ring.

6. A liquid applying apparatus as defined in claim 1, wherein:

the ring accommodation annular groove is defined by an inner annular ridge formed on the top surface of the disk table and a plurality of standing pins provided along a circle on the top surface of the disk table, the circle having a diameter greater than the inner annular ridge; and the ring pressing annular ridge is formed on the underside surface of the cover member.

7. A liquid applying apparatus as defined in claim 6, wherein the cover member is formed with a plurality of recesses in an outermost periphery thereof, the recesses are engageable with the plurality of standing pins on the disk table.

8. A liquid applying apparatus as defined in claim 1, wherein:

the ring accommodation annular groove is formed in the underside surface of the cover member; and the ring pressing annular ridge is formed on the top surface of the disk table.

9. A liquid apparatus as defined in claim 5, wherein the sealing ring has a circular cross sectional configuration.

10. A liquid applying apparatus comprising:
   a rotary member rotatable about a rotary axis and having a disk table in which a substrate to be applied with liquid is placed;
   a driving mechanism which drives the rotary member at a high speed;
   a cover member movable above the disk table and operable to define a closed space in combination with the disk table;
   an elevating mechanism which elevates the cover member up and down in a direction parallel to said rotary axis, the elevating mechanism including a holder member for holding the cover member;
   said cover member when in a down position combining with said disk table to define said closed space and to preclude relative rotary movement between said cover member and said disk table; and
   a connecting arrangement provided between the cover member and the holder member for connecting the cover member and the holder member when the cover member is elevated up, and disconnecting the cover member from the holder member when the cover member is combined with the disk table, the connecting arrangement including:
   a flange formed on either the cover member or the holder member, the flange having an outer periphery having a non-circular configuration; and
   a hole formed in either the cover member or the holder member, the hole having an inner periphery having a configuration corresponding to the outer periphery of the flange, such that when said elevating mechanism elevates the cover member, the outer periphery of the flange and the inner periphery of the hole are in mating correspondence with one another to thereby facilitate positioning of the cover member in a fixed rotative position relative to the rotative position of the disk table as the cover member is elevated up and down.

11. A liquid applying apparatus as defined in claim 10, wherein the outer periphery of the flange is formed with a slanting surface and the inner periphery of the hole is formed with a slanting surface disposed in mating correspondence with the slanting surface of the outer periphery of the flange.

12. A liquid applying apparatus as defined in claim 10, wherein the flange and the hole each have a polygonal configuration.

13. A liquid applying apparatus as defined in claim 12, wherein the flange and the hole each have a square configuration.

14. A liquid applying apparatus as defined in claim 10, wherein:
   the cover member is formed with a neck portion at a center on a top surface thereof, the neck portion having a stem portion and an upper portion, the flange being formed on the upper portion of the neck portion; and
   the hole is formed in a center of the holder member, the hole having a horizontal cross sectional size smaller than a horizontal cross sectional size of the flange and greater than a horizontal cross sectional size of the stem portion of the neck portion.

15. A liquid applying apparatus as defined in claim 10, wherein:
   the holder member is formed with a hanger portion at a center on an underside surface thereof, the hanger portion having a stem portion and a lower portion, the flange being formed on the lower portion of the hanger portion; and
   the hole is formed in a center of the cover member, the hole having a horizontal cross sectional size smaller than a horizontal cross sectional size of the flange and greater than a horizontal cross sectional size of the stem portion of the hanger portion.

16. A liquid applying apparatus as defined in claim 2, wherein the outer annular ridge is formed with a through hole.

17. A liquid applying apparatus as defined in claim 2, wherein the outer ridge is formed with a plurality of through holes.

18. A liquid applying apparatus as defined in claim 16, wherein the through hole extends from the outer surface to the inner surface of the outer annular ridge for allowing access to the sealing ring by a removing rod.

19. A liquid applying apparatus comprising:
   a rotary member having a disk table in which a substrate to be applied with liquid is placed;
   a driving mechanism which drives the rotary member about a rotary axis at a high speed;
   a cover member movable above the disk table and operable to define a dosed space in combination with the disk table;
   an elevating mechanism which elevates the cover member up and down in a direction parallel to said rotary axis;
   a sealing arrangement provided between the disk table and the cover member to seal the closed space, the sealing arrangement including:
   a resilient sealing ring;
   a ring accommodation annular groove formed in either a top surface of a periphery of the disk table or an underside surface of a periphery of the cover member, said ring accommodation on groove being formed between an inner annular ridge and an outer annular ridge, said outer annular ridge having an inner ridge surface and an outer ridge surface;
   a ring pressing annular ridge formed on either a top surface of a periphery of the disk table or an underside surface of a periphery of the cover member, the ring pressing annular ridge coming into contact with the sealing ring to press the sealing ring radially outwardly against the inner ridge surface of the outer annular ridge when the cover member is combined with the disk table, whereby the ring pressing member is operable to facilitate installation of the sealing ring in said groove as said ring pressing member presses said sealing ring radially outwardly toward said inner ridge surface of the outer annular ridge; and
   a through passage extending between said outer ridge surface and said inner ridge surface, said through passage receiving a seal-engaging rod which is operable to pass through said passage to engage and move said sealing ring and thereby facilitate removal of said sealing ring from said groove.

20. A liquid applying apparatus comprising:
   a rotary member rotatable about a rotary axis and having a disk table in which a substrate to be applied with liquid is placed;
   a driving mechanism which drives the rotary member at a high speed;
   a cover member movable above the disk table and operable to define a closed space in combination with the disk table;
   an elevating mechanism which elevates the cover member up and down in a direction parallel to said rotary axis, the elevating mechanism including a holder member for holding the cover member;

said cover member when in a down position combining with said disk table to define said closed space; and a connecting arrangement provided between the cover member and the holder member for connecting the cover member and the holder member when the cover member is elevated up, and disconnecting the cover member from the holder member when the cover member is combined with the disk table, the connecting arrangement including:

a flange formed on either the cover member or the holder member, the flange having an outer periphery with a non-circular configuration; and a hole formed in either the cover member or the holder member, the hole having an inner periphery with a non-circular configuration corresponding to the non-circular configuration of said outer periphery of the flange such that mating engagement of said non-circular configuration of said outer periphery of the flange with said non-circular configuration of said inner periphery of the hole precludes relative rotation between said flange and said hole;

said non-circular configuration of said outer periphery of the flange and said non-circular configuration of said inner periphery of the hole being in mating engagement with one another when the cover member is elevated up and down by said elevating mechanism to thereby facilitate positioning and maintaining the cover member in fixed rotative position relative to the rotative position of the disk table as the cover member is moved up and down.

21. A liquid applying apparatus as defined in claim 20, wherein the outer periphery of the flange is formed with a slanting surface disposed at an acute angle relative to said rotary axis and the inner periphery of the hole is formed with a slanting surface disposed at an acute angle relative to said rotary axis and disposed in mating engagement with the slanting surface of the outer periphery of the flange as the cover member is elevated up and down by said elevating mechanism, whereby the mating engagement of said slanting surfaces facilitate preclusion of deflection of the cover member relative to said disk member.

22. A liquid applying apparatus according to claim 20, wherein said flange and said hole are formed at the respective centers of the cover and the disk table thereby facilitating axial alignment of the cover member and the disk table when the outer periphery of the flange and the inner periphery of the hole are in mating engagement with one another.

* * * * *